US011662225B2

(12) United States Patent
Kantor et al.

(10) Patent No.: US 11,662,225 B2
(45) Date of Patent: May 30, 2023

(54) INDUCTIVE SENSOR DEVICE FOR DETERMINING A LONGITUDINAL POSITION OF A MOVEABLE OBJECT ALONG A SENSITIVE AXIS OF THE SENSOR DEVICE AND METHOD FOR OPERATING A SENSOR DEVICE OF THIS KIND

(71) Applicant: Balluff GmbH, Neuhausen a.d.F. (DE)

(72) Inventors: Zoltan Kantor, Nemesvámos (HU); Attila Szabó, Iszkaszentgyörgy (HU)

(73) Assignee: Balluff GmbH, Neuhausen a.d.F. (DE)

( * ) Notice: Subject to any disclaimer, the term of this patent is extended or adjusted under 35 U.S.C. 154(b) by 0 days.

(21) Appl. No.: 17/524,028

(22) Filed: Nov. 11, 2021

(65) Prior Publication Data

US 2022/0196438 A1    Jun. 23, 2022

(30) Foreign Application Priority Data

Dec. 18, 2020    (DE) ...................... 10 2020 134 217.9

(51) Int. Cl.
*G01D 5/22*      (2006.01)
*H03K 17/95*    (2006.01)

(52) U.S. Cl.
CPC ......... *G01D 5/2291* (2013.01); *H03K 17/954* (2013.01)

(58) Field of Classification Search
CPC ........ G01D 5/20; G01D 5/2006; G01D 5/202; G01D 5/2046; G01D 5/2225; G01D 5/2291; H03K 17/954; G01B 7/003
See application file for complete search history.

(56) References Cited

U.S. PATENT DOCUMENTS 5,339,029 A  *  8/1994  Wagner ............... G01D 5/2258
                                                                324/207.17
6,714,004 B2    3/2004  Jagiella
                (Continued)

FOREIGN PATENT DOCUMENTS

DE    100 25 661 A1    12/2001
WO    2019/063679 A1    4/2019

OTHER PUBLICATIONS

German Search Report dated Aug. 4, 2021 in German Application No. 10 2020 134 217.9 with English translation of the relevant parts.

*Primary Examiner* — Steven L Yeninas
(74) *Attorney, Agent, or Firm* — Collard & Roe, P.C.

(57) ABSTRACT

An inductive sensor device has a coil arrangement and sensor electronics for determining a longitudinal position of an at least partially electrically conductive and/or magnetically polarizable object moveable at a distance from a device end face along a device sensitive axis. The arrangement has a substantially planar exciting coil for producing an alternating magnetic field for inducing eddy currents and/or magnetic polarization in the object and a first substantially planar receiving coil substantially parallel to and overlapping the exciting coil. The coils are substantially parallel to the end face. The sensor electronics determine at least one parameter of an exciting coil electrical signal, which is variable owing to an inductive backward effect of the object, at least one parameter of a voltage inducible in the at least first receiving coil based on this effect, and the longitudinal position from the determined signal parameter and the determined voltage parameter.

35 Claims, 15 Drawing Sheets

(56) References Cited

U.S. PATENT DOCUMENTS

| | | | | |
|---|---|---|---|---|
| 7,285,950 | B2* | 10/2007 | Jagiella | F15B 15/2892 |
| | | | | 324/207.25 |
| 9,607,261 | B1* | 3/2017 | Zonana | G06M 1/274 |
| 2006/0208725 | A1* | 9/2006 | Tapson | G01D 5/2291 |
| | | | | 324/207.17 |
| 2008/0204116 | A1* | 8/2008 | James | G01D 5/2093 |
| | | | | 327/517 |
| 2015/0369631 | A1* | 12/2015 | Cheung | G01D 5/2013 |
| | | | | 336/200 |
| 2016/0069662 | A1* | 3/2016 | Mullenix | G01D 5/2225 |
| | | | | 324/207.15 |
| 2017/0074682 | A1* | 3/2017 | Kántor | G01D 5/2266 |
| 2017/0344878 | A1* | 11/2017 | Kántor | G06N 3/063 |
| 2018/0331684 | A1* | 11/2018 | Koizumi | G01D 5/204 |
| 2018/0340986 | A1* | 11/2018 | Latham | G01R 33/09 |
| 2018/0340990 | A1* | 11/2018 | Latham | G01R 33/098 |
| 2020/0287541 | A1* | 9/2020 | Müsch | H03K 17/9505 |

* cited by examiner

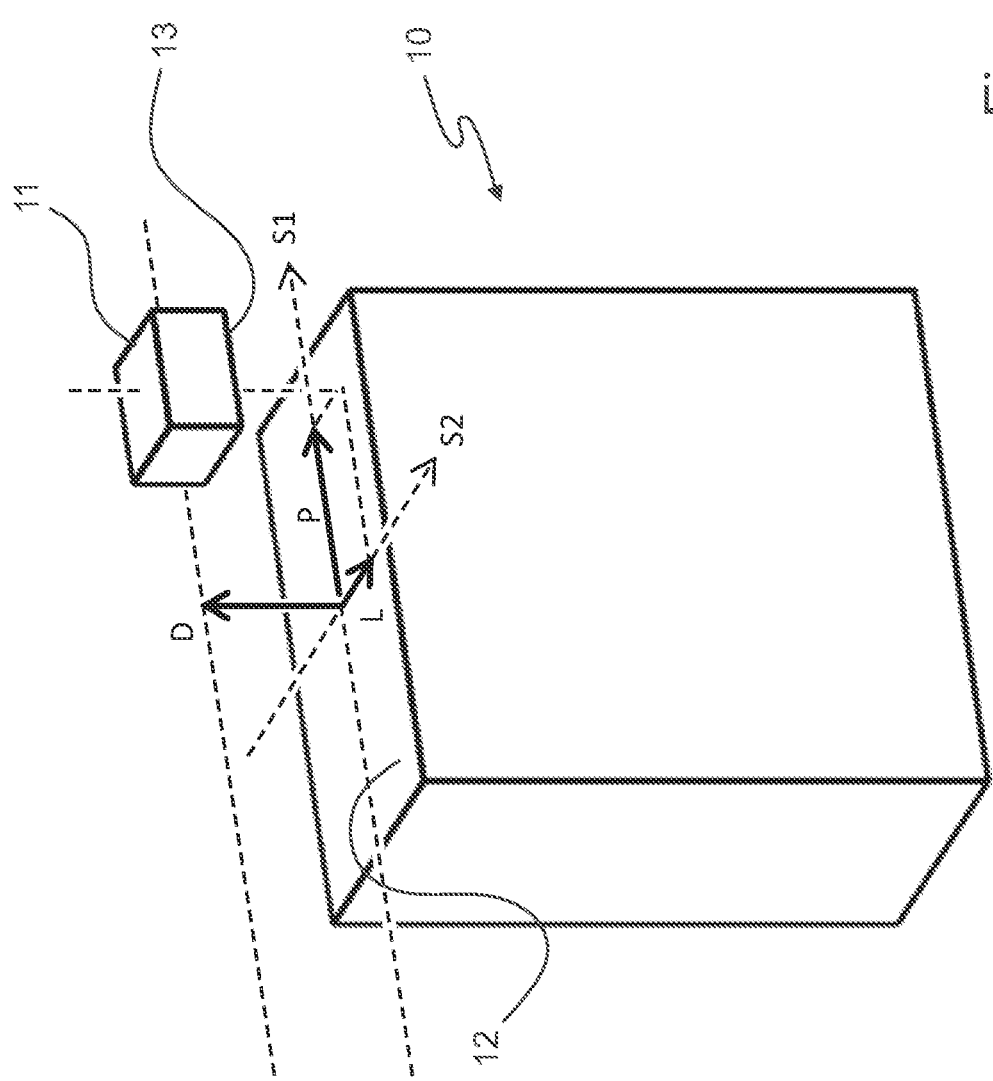

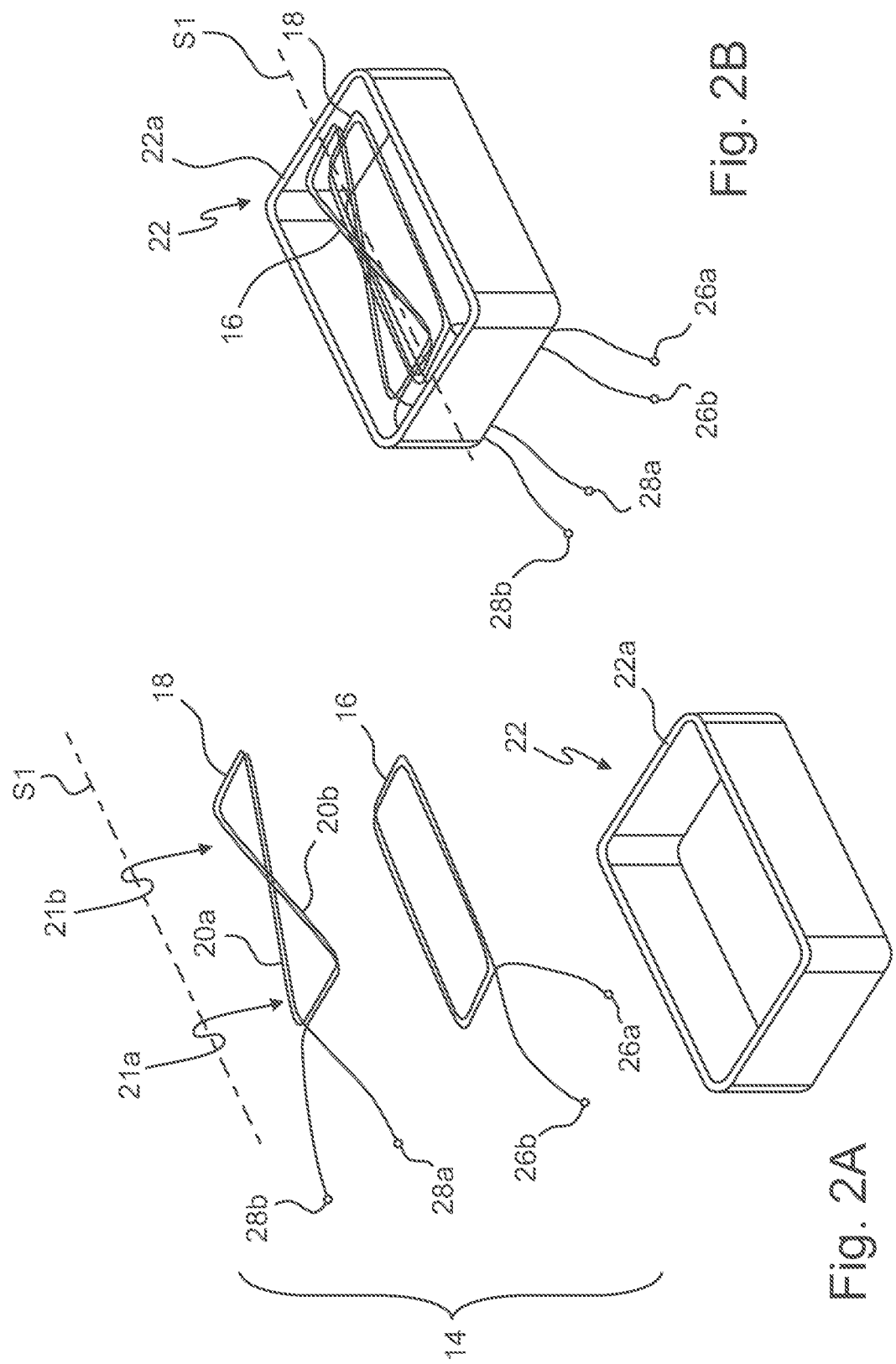

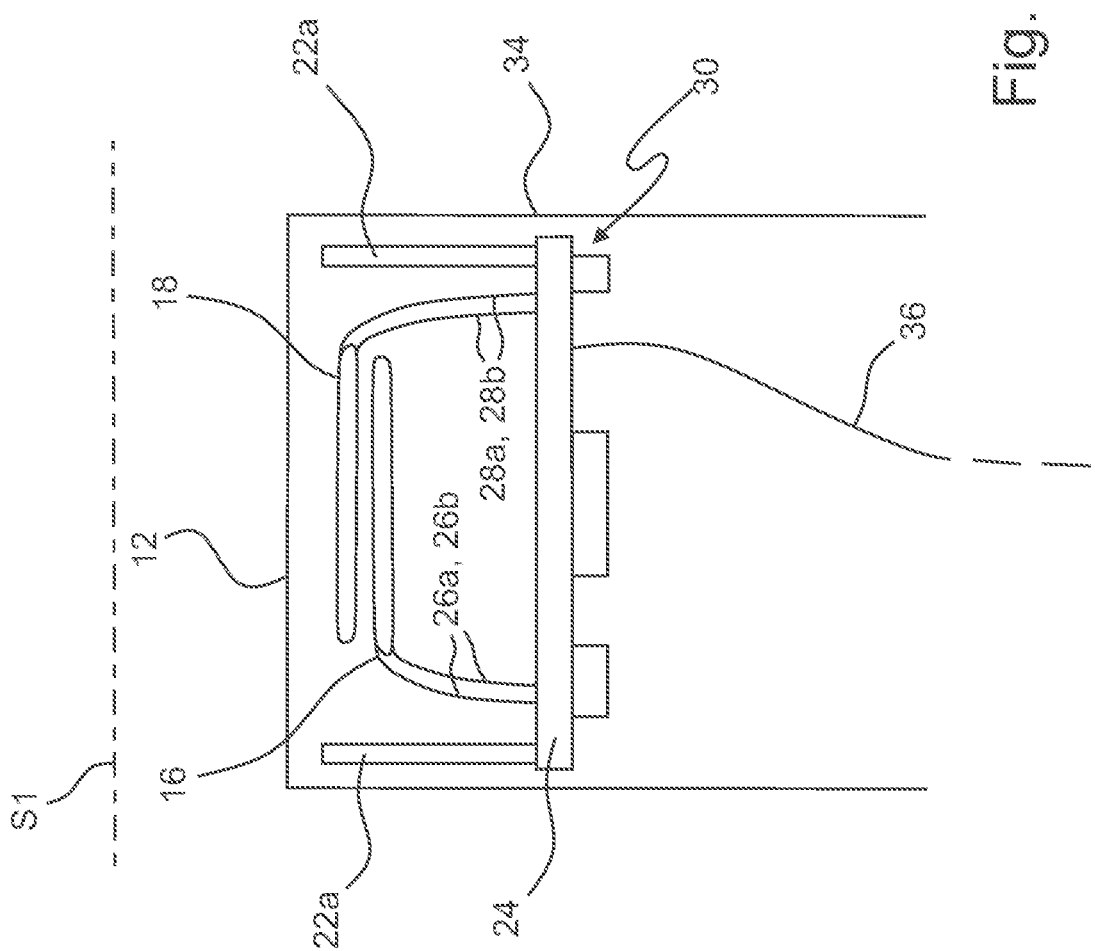

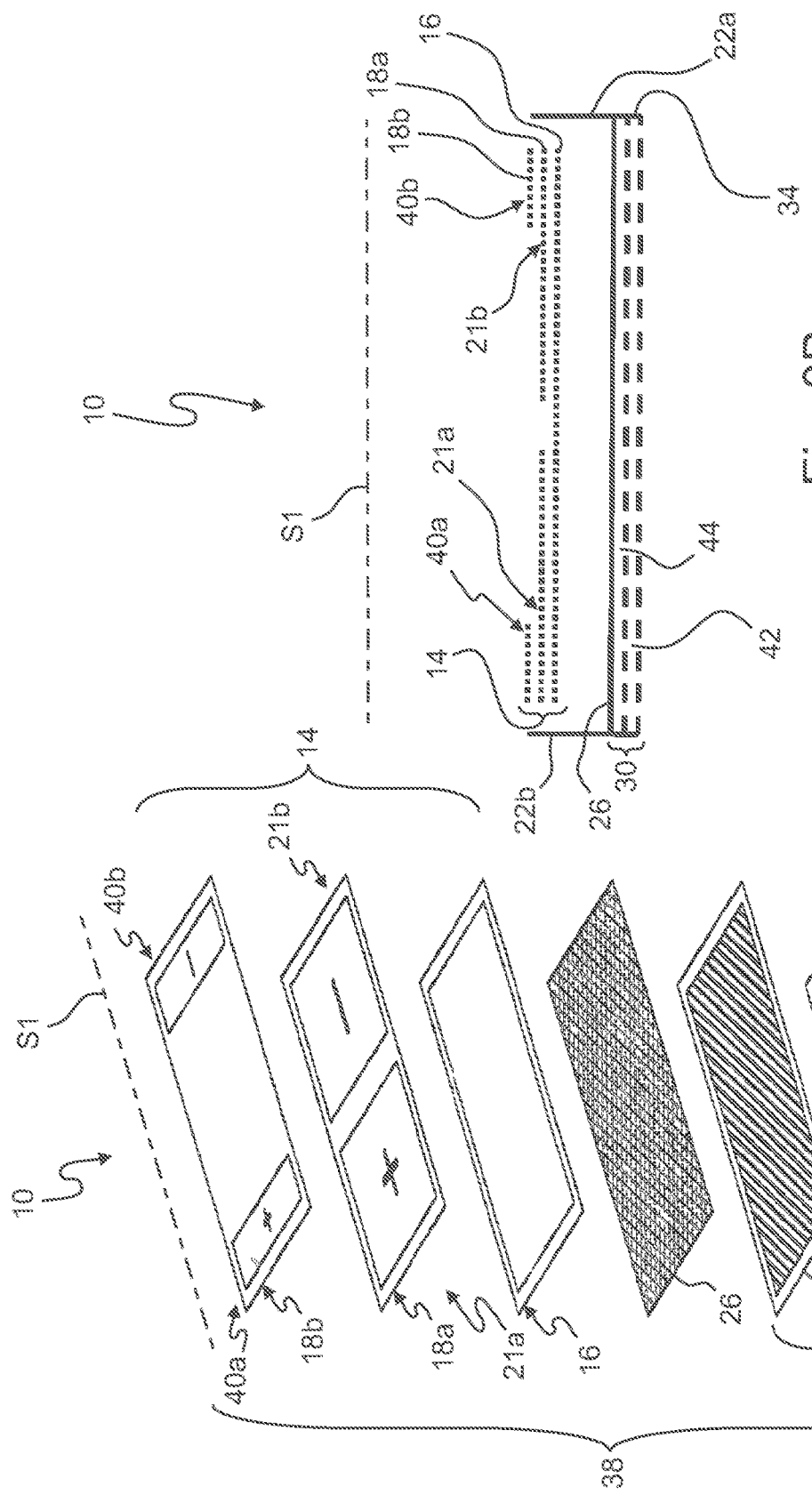

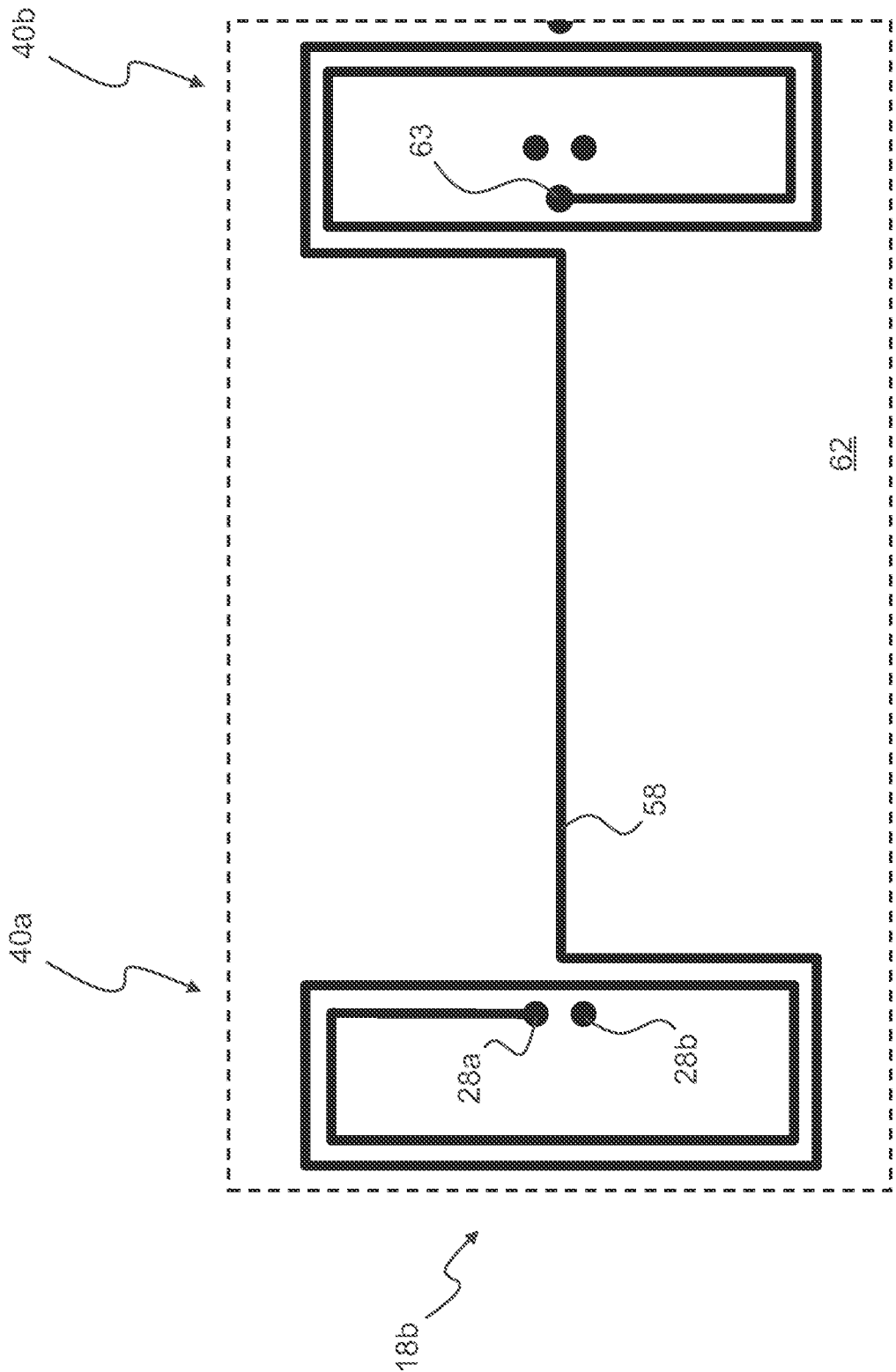

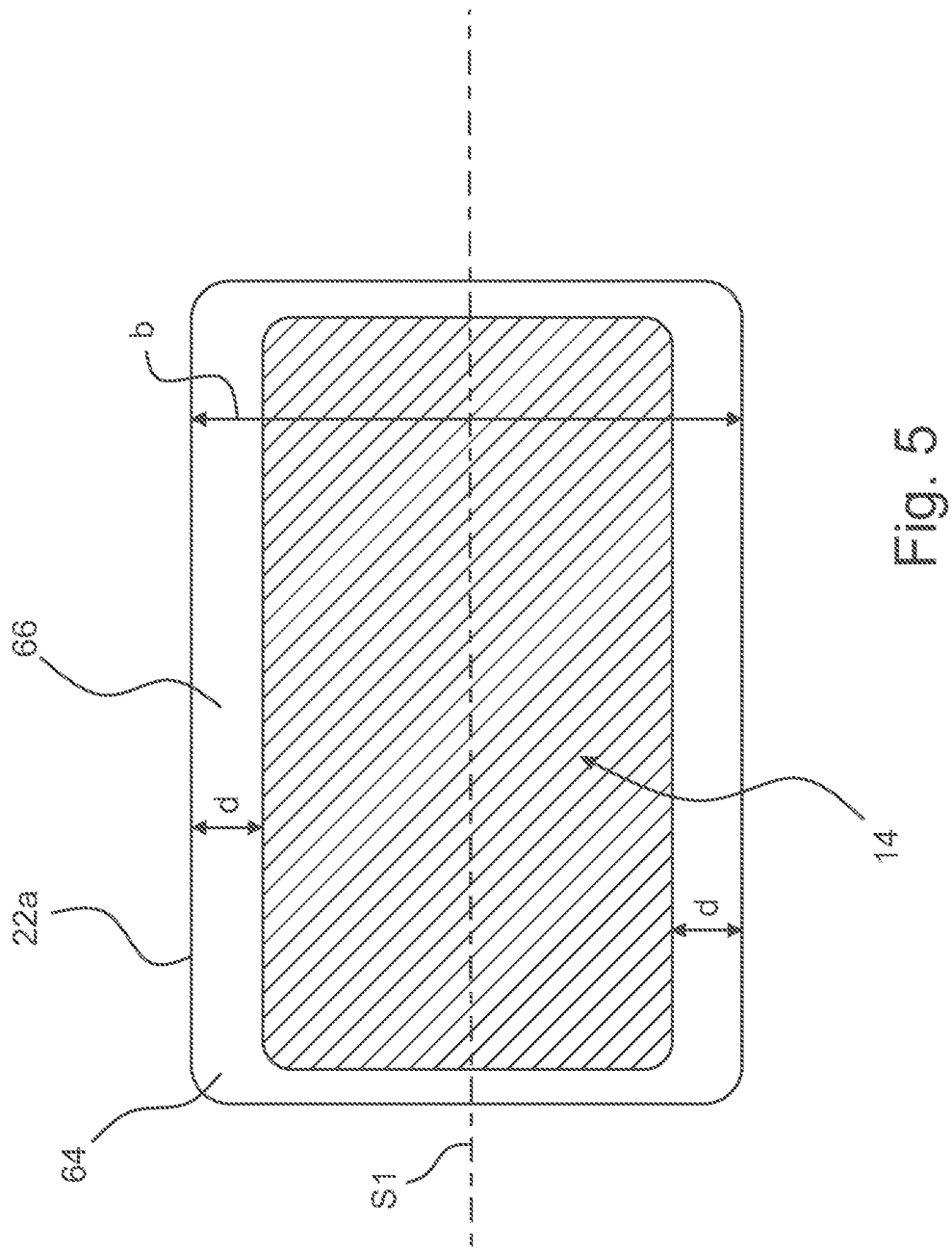

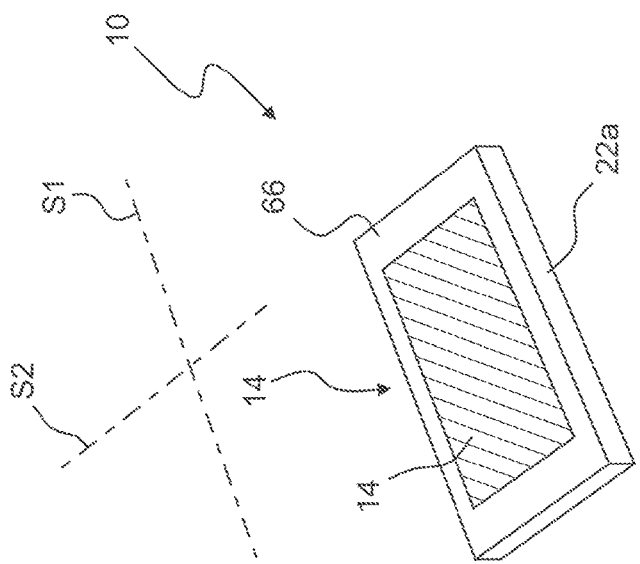
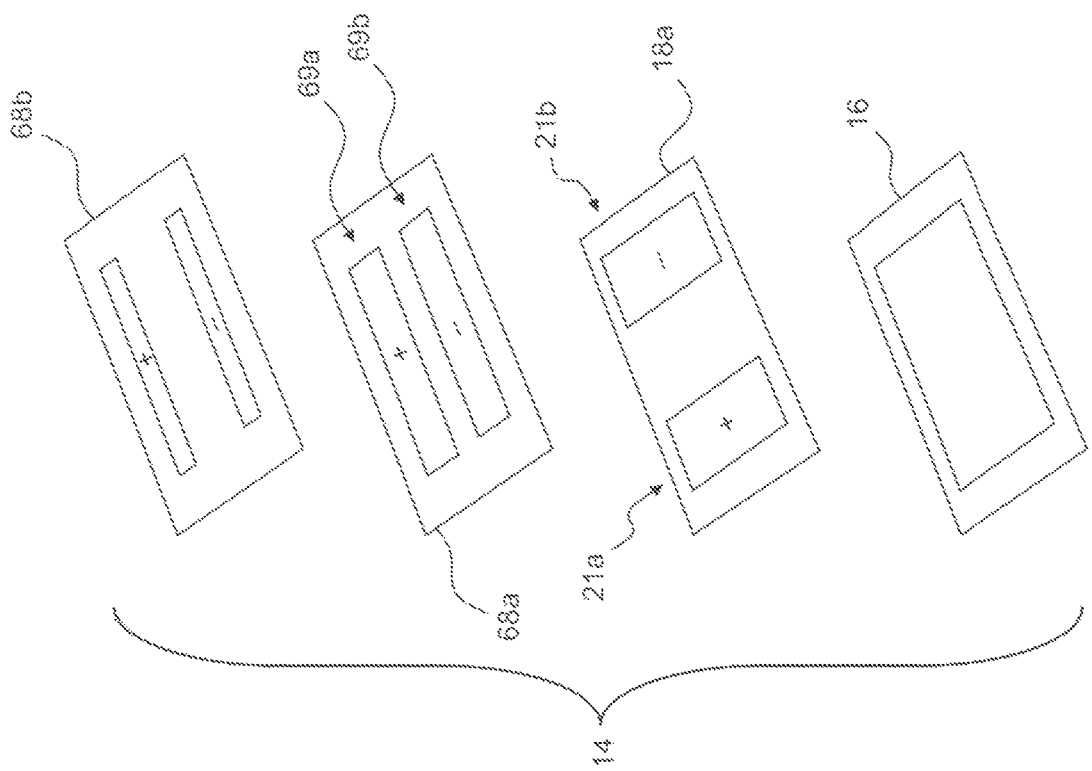
Fig. 6B
Fig. 6A

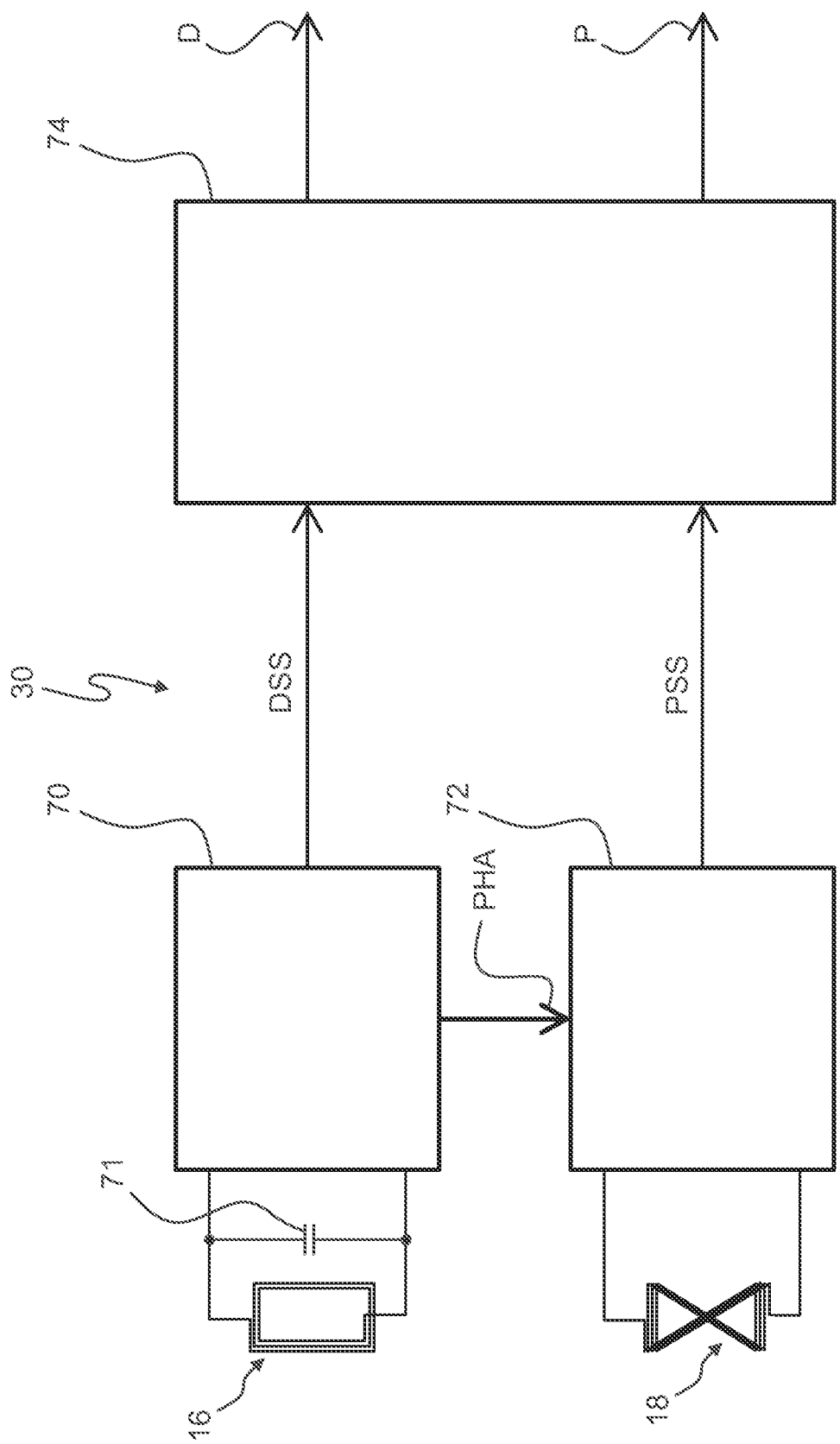

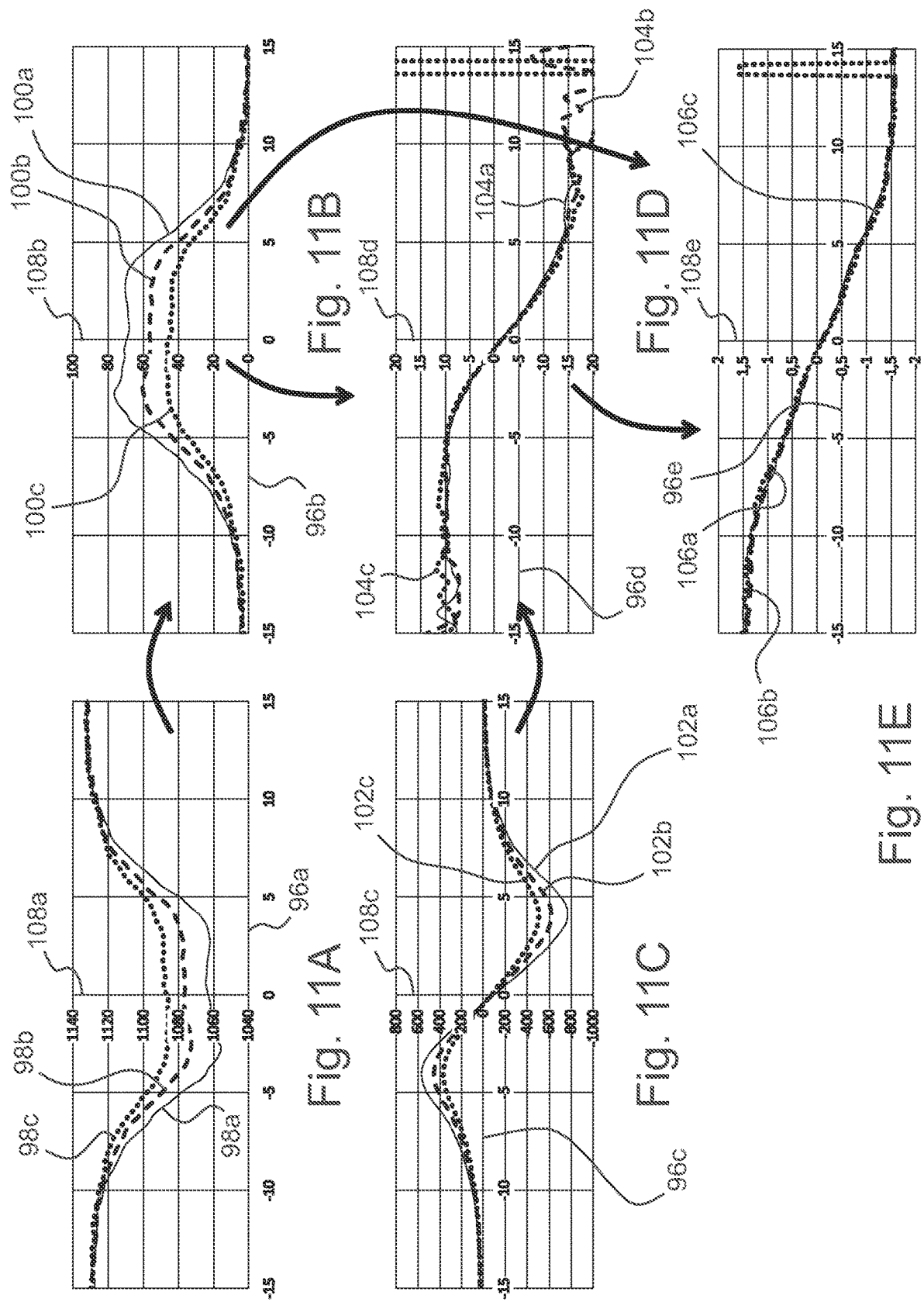

INDUCTIVE SENSOR DEVICE FOR DETERMINING A LONGITUDINAL POSITION OF A MOVEABLE OBJECT ALONG A SENSITIVE AXIS OF THE SENSOR DEVICE AND METHOD FOR OPERATING A SENSOR DEVICE OF THIS KIND

CROSS REFERENCE TO RELATED APPLICATIONS

Applicant claims priority under 35 U.S.C. § 119 of German Application No. 10 2020 134 217.9 filed Dec. 18, 2020, the disclosure of which is incorporated by reference.

BACKGROUND OF THE INVENTION

1. Field of the Invention

The invention relates to an inductive sensor device for determining a longitudinal position of a moveable object along a sensitive axis of the sensor device, a method for operating a sensor device and a program for data processing equipment.

2. Description of the Related Art

It is known from practice that in the case of inductive position sensors, a magnetic field of an exciting coil acts on a metallic object, which in its turn generates a magnetic field that induces a voltage in one or more receiving coils. The position between the sensor device and the object can be determined from the induced voltage. Typically, the exciting coil is oriented along a longitudinal axis, which corresponds simultaneously to a sensitive axis of the sensor device. The receiving coil should be designed in such a way that the induced voltage in the receiving coil is zero if there is no object in the vicinity.

The inductive position sensor device BIP CD2-T017-04-BP02 from Balluff GmbH, Neuhausen auf den Fildern, is configured with a series of substantially identical wire-wound coils with a ferrite core. Each coil is connected successively in parallel with a capacitor and operated as an LC oscillator. The oscillation amplitude of each coil is altered as a function of the approach of a metallic object, and the longitudinal position of the object is calculated from the changes in the oscillation amplitudes.

The inductive position sensor device BIP ED2-B133-03-S75 from Balluff GmbH, Neuhausen auf den Fildern, is an inductive sensor device, which has as a serial sensor a coil system, which is formed in printed-circuit board technology. The sensor device has an exciting coil and several receiving coils connected in series, which have crossed and non-crossed windings. Determination of the object position relative to the sensor device utilizes a perpendicular component of a magnetic field of an object. Both a relative and an absolute voltage as well as a phase of the induced voltage in the receiving coils depend on the object position corresponding to a sine function and a cosine function. The sensor device is operable at a fixed excitation frequency. The longitudinal measuring range is about 130 millimeters (mm).

A coil system of the inductive sensor device described in WO 2019/063679 A1 has an exciting coil and two receiving coils. The exciting coil is excitable with an oscillating circuit as an element of an LC circuit. The first receiving coil has two segments arranged successively in the longitudinal direction, which are oppositely oriented. The second receiving coil has three segments arranged symmetrically in the longitudinal direction. An area of the segment in the middle is as large as the area of the total area of the other two segments arranged in the longitudinal direction at the ends of the coil system. The exciting coil surrounds the two receiving coils. On the basis of signals of the two receiving coils, the longitudinal position of an electrically conductive or metallic object is identifiable and correspondingly output of a switching signal is possible.

The miniaturization of the aforementioned sensor devices, for example to a total length of 15 mm with at least 10 mm measuring range, is particularly difficult. On the one hand, it is difficult to operate a miniaturized sensor device with a constant excitation frequency, as the complex impedance of the exciting coil in the case of a smaller sensor device varies significantly in the vicinity of the object, which in resonant operation leads to toning down of the resonant frequency. On the other hand, when miniaturizing a coil arrangement with a constant number of coils it is difficult to provide wires, openings through printed-circuit boards etc. in a very much reduced space. Furthermore, it is also problematic to reduce the non-sensitive or non-linearizable blind zones at the ends of the sensor devices appropriately and produce an acceptable sensing range.

There is consequently a need for a new concept and a new operating mode of a sensor device that is small, with dimensions roughly corresponding to its measuring range.

SUMMARY OF THE INVENTION

It is a problem to be solved of the present invention to provide a small sensor device whose dimensions roughly correspond to its measuring range.

According to a first aspect, an inductive sensor device is provided for determining a longitudinal position of an object which is moveable at a distance from an end face of the sensor device and which is at least partially electrically conductive and/or magnetically polarizable, along a sensitive axis of the sensor device, wherein the sensor device has a coil arrangement and sensor electronics, wherein the coil arrangement has a substantially planar exciting coil, by means of which an alternating magnetic field for inducing eddy currents and/or magnetic polarization can be generated in the object, and a first substantially planar receiving coil, which is arranged substantially parallel to and overlapping the exciting coil, wherein the exciting coil and the first receiving coil are arranged substantially parallel to the end face of the sensor device, wherein the sensor electronics are arranged to determine at least one parameter of an electrical signal of the exciting coil, which is variable owing to a backward effect of the object, and at least one parameter of a voltage inducible in the first receiving coil owing to the backward effect of the object and to determine the longitudinal position from the at least one parameter determined of the inducible electrical signal of the exciting coil and the at least one parameter determined of the inducible voltage of the first receiving coil.

In an exciting coil of a coil arrangement of an inductive sensor device, a temporally alternating magnetic field may be producible, which in its turn may generate eddy currents in a moveable object which may be at least partially electrically conductive, and/or magnetic polarization of the object which may be at least partially magnetically polarizable. The temporally alternating eddy currents and/or the magnetic polarization generate in their turn an alternating magnetic field, so that the object may exert an inductive backward effect both on the exciting coil and on a first receiving coil of the coil arrangement. "Backward effect" in this context may be understood as an electrical effect on the coils located near the object due to the eddy currents generated in the object and/or the magnetic polarization of the object. Consequently, owing to the presence of the object in the vicinity of the coil arrangement, oscillation parameters of the electrical signals of the exciting coil (e.g., current or voltage amplitude, oscillation frequency) may be variable, and a voltage may be inducible in the receiving coil. The oscillation parameters of the exciting coil may be used together with the parameter obtained from the inducible voltage of the first receiving coil for determining a longitudinal position of the object along the sensitive axis in particular relative to a reference point, for example a mid-point, of the sensor device.

The coil arrangement may in particular have just one exciting coil.

The first receiving coil may advantageously be configured so that the determined parameter of the inducible voltage of the first receiving coil depends monotonically on the longitudinal position of the object at least in the vicinity of a mid-point of the sensor device. For example, the at least one parameter may be a monotonically increasing or monotonically decreasing function of the longitudinal position.

The sensitive axis may correspond to a direction along which a variation of the at least one parameter of the electrical signal of the exciting coil and/or of the at least one parameter of the inducible voltage of the first receiving coil may occur. The coil arrangement may be arranged on a side of an end face of a sensor housing, in which the coil arrangement may be housed, that is turned away from the object. The object may be moving or moveable along a trajectory at a distance from the sensor housing, for example from the end face of the sensor housing. Said distance may in particular be measured vertically between the end face of the sensor housing and a surface of the object. Both the changes of the parameters of the electrical signals of the exciting coil compared to an object-free state and the inducible voltage of the first receiving coil are determined by the three-dimensional arrangement of the object with respect to the coil system, in particular by the longitudinal position and the distance. As long as the object moves along a constant longitudinal trajectory, e.g., at a fixed distance from an end face, the longitudinal position may be determinable within a monotonicity region of a parameter of the inducible voltage in a receiving coil. In the case of a variable distance, the relationship between the longitudinal position of the object and the parameter of the inducible voltage in a receiving coil may no longer be unambiguous. In other words, in such a case each longitudinal position of the object may also depend on the distance. For example, at greater distances, the amplitude of an inducible voltage of the first receiving coil may typically be smaller than at smaller distances.

The inductive sensor device may be of particularly small configuration, as the sensor device can exploit the inductive backward effect of the object that an at least partially electrically conductive and/or magnetizable object can exert on the whole coil arrangement of the sensor device and in particular also on the exciting coil, so that the exciting coil itself may also be regarded as an additional sensor coil and can be used for the evaluation. For each longitudinal position of an object, at great distances the change in the parameter of the electrical signal of the exciting coil may typically be smaller than at smaller distances. Therefore, by using the exciting coil as a sensor coil, the distance dependence of the parameter of a signal of the inducible voltage of the receiving coil can be compensated, without having to use an additional receiving coil in the coil arrangement.

Moreover, the sensor device may be of particularly small configuration, as it can have few components and the coil arrangement may be of planar configuration and therefore the three-dimensional space required for the coils may be small. In particular, the sensor device may be made in such a way that it can be configured with a dimension (for example of a housing) along the sensitive axis less than or equal to about 15 mm and laterally thereto, less than or equal to about 10 mm with a longitudinal measuring range greater than or equal to about 10 mm. A depth of the sensor device, which is measured perpendicularly to the end face of the sensor device, can be about 12 mm with miniaturized sensor electronics, e.g., an application-specific integrated circuit (ASIC).

Owing to the size of the sensor device, this is usable in various ways, for example in gripping systems for determining the position of a gripper, etc., and can be integrated subsequently in a simple manner in existing equipment. The sensor device may also be suitable for determining a position of a rotating object with a rotary speed of for example over 40 000 revolutions per minute (for example a rotating spindle), because owing to joint evaluation of the signal of the exciting coil and of the first receiving coil, the sensor device may have a short response time and therefore a high output transfer rate for position determination. The sensor device may, for example owing to its size, be mounted flush with the surface.

The first receiving coil may be arranged with its surface extending in the plane of its coil parallel to the extension of the surface of the exciting coil and towards the end face of the sensor device and therefore towards the object. Alternatively, the exciting coil may also be arranged towards the end face of the sensor device and therefore towards the object, whereas the first receiving coil may be arranged on the side of the exciting coil turned away from the end face. Alternatively, the exciting coil may surround the first receiving coil substantially in the plane of its own coil, or both coils may be wound on the same coil former.

In one embodiment, the sensor electronics may be configured for determining the vertical distance of the object between the end face of the sensor device and the object, from the at least one parameter of the electrical signal of the exciting coil that has been determined and the at least one parameter of the inducible voltage of the first receiving coil that has been determined. Therefore, multifunctional use of the sensor device is possible.

In one embodiment, the first receiving coil may be of anti-symmetrically polarizable configuration. For example, the voltage inducible in the first receiving coil may have substantially the same amplitude with opposite phase in different directions along the sensitive axis, at equal distances and at equal longitudinal distances of the object from a mid-point of a measuring range, which may be defined by a mid-point of the receiving coil. As a result, the position determination and optionally the distance determination may take place as a function of the phase and the amplitude of the inducible voltage.

The sensitive axis may then be defined by the antisymmetric polarization of the first receiving coil, wherein the sensitive axis may extend in a plane of the coil and along a center line of the first receiving coil and thus one half-coil viewed along the sensitive axis may have a first polarization and a second half-coil may have an opposite polarization.

In one embodiment, the coil arrangement may have a second substantially planar and optionally also anti-symmetrically polarizably configured receiving coil, which may be arranged substantially parallel to and overlapping the exciting coil, wherein the second receiving coil may overlap the first receiving coil (in particular only) in the end region or end regions thereof and may be connected electrically in series with the first receiving coil. In other words, windings of the second receiving coil, viewed along the sensitive axis, may be arranged overlapping with an end region or both end regions of windings of the first coil. As a result, an increased inducible voltage may be provided in both end regions of the coil system, so that the longitudinal measuring range can be lengthened.

Both the first and the second receiving coil may consist of several part-coils and the part-coils of the receiving coils may be connected in series in any order with correct polarization.

Moreover, the second receiving coil may be arranged between the exciting coil and the first receiving coil or adjacent to the first receiving coil, towards the end face of the sensor device.

In one embodiment, the coil arrangement may have a third substantially planar receiving coil, which may be arranged substantially parallel to and overlapping the exciting coil and may define an additional sensitive axis of the sensor device, which may run substantially perpendicularly to the sensitive axis of the first receiving coil, wherein the sensor electronics may be configured to determine at least one parameter of a voltage inducible in the third receiving coil due to the inductive backward effect of the object and from the at least one parameter of the electrical signal of the exciting coil that has been determined and the at least one parameter of the inducible voltage of the third receiving coil that has been determined, to determine a lateral position of the object along the additional sensitive axis and optionally the vertical distance. The third receiving coil may also be of anti-symmetrically polarizable configuration. The sensitive axis and the additional sensitive axis may in particular extend in a plane parallel to the end face. In other words, the first and third receiving coil may be turned relative to one another by 90 degrees in their respective coil plane. In this way, a two-dimensional movement of the object in a plane parallel to the end face of the sensor device can be detectable.

The additional sensitive axis may, like the sensitive axis, correspond to an additional direction, along which a variation of the at least one parameter of the electrical signal of the exciting coil and/or of the at least one parameter of the inducible voltage of the third receiving coil may occur. The additional sensitive axis may be defined by the antisymmetric polarization of the third receiving coil, wherein the additional sensitive axis may extend in a plane of the coil and along a center line of the third receiving coil, and thus a half-coil of the third receiving coil, viewed along the sensitive axis, may have a first polarization, and a second half-coil of the third receiving coil may have an opposite polarization.

Determination of the lateral position may be carried out similarly to determination of the longitudinal position. Moreover, the at least one parameter of the inducible voltage of the first receiving coil may be replaced in the practicable signal processing with the at least one parameter of the inducible voltage of the third receiving coil.

In one embodiment, the coil arrangement may have a fourth substantially planar and optionally also anti-symmetrically polarizably configured receiving coil, which may be arranged substantially parallel to and overlapping the exciting coil, wherein the fourth receiving coil may overlap the third receiving coil (in particular only) in an end region or end regions thereof and may be connected electrically in series with the second receiving coil. In other words, the windings of the fourth receiving coil, viewed along the additional sensitive axis, may be arranged overlapping an end region or both end regions of the third receiving coil. As a result, an increased inducible voltage may be provided in the two end regions of the coil system, so that the lateral measuring range can be extended.

In one embodiment, the exciting coil, the first receiving coil, the second receiving coil, the third receiving coil and/or the fourth receiving coil may be arranged on or in one or more layers of a printed-circuit board. The production of a sensor device based (in particular exclusively) on printed-circuit board technology may be particularly economical.

In one embodiment, the exciting coil, the first receiving coil, the second receiving coil, the third receiving coil and/or the fourth receiving coil may be made by the wire-wrapping technique. Wrapping of the coils as wire loops may make simple miniaturization of the sensor device possible.

Preferably, all receiving coils may be made in one and the same way.

The wound coils may be made on a coil former or without a coil former. A coil former may be produced by 3D printing technology.

In one embodiment, windings of coil segments, for example half-coils, of the first, second, third and/or fourth receiving coil, viewed along their respective sensitive axis, may be directed oppositely. The receiving coil may therefore be of anti-symmetrically polarizable configuration, so that through the presence of the object in one or other half-coil of the coils, a voltage with opposite polarity may be inducible, whereas with a central longitudinal or lateral position of the object, the inducible voltage may be almost zero.

In one embodiment, the first, second, third and/or fourth receiving coil, viewed along their respective sensitive axis, may have substantially centrally crossed windings. This measure may also have the effect that the respective receiving coil may be of anti-symmetrically polarizable configuration, so that through the presence of the object in one or other half-coil of the coils, a voltage with opposite polarity may be inducible, whereas with a central longitudinal position of the object, the inducible voltage may be almost zero.

In the case when the first, second and/or third receiving coil may be wound, this coil with crossed windings or with opposed-wound coil segments, which are connected to one another by means of a wire, may be in the form of a butterfly coil.

The two types of the anti-symmetrically polarizable receiving coil described may also allow mounting of the sensor devices in metallic surroundings, because in contrast to a receiving coil with non-antisymmetric properties, only a small background signal, if any, may occur in the receiving coil owing to its mounting.

In one embodiment, the sensor device may further comprise a first electrically conductive shielding element, which may surround the coil arrangement laterally, in particular completely. The shielding element may be formed strip-shaped, in particular as a continuous strip. The first shielding element may be configured as metal foil(s) or as a metallic coating on a housing wall of a housing of the sensor device or as edge metallization of a multilayer printed-circuit board and/or extend substantially perpendicularly to the end face of the sensor device. It may thus be possible for the sensor device to be mounted flush in metallic surroundings with only a very small or no metal-free zone around the sensor device.

In one embodiment, the sensor device may further comprise a second electrically conductive, planar shielding element, which may be arranged on a side of the coil arrangement that is turned away from the object. The second shielding element may be formed as a metal plate or, if the coils are configured in the layers of a printed-circuit board, on a separate layer of the printed-circuit board. The sensor electronics may further be arranged on a side of the second shielding element turned away from the exciting coil.

The coil arrangement and the sensor electronics and optionally the first and/or second shielding element, if present, may be accommodated in one housing.

In one embodiment, viewed in a direction perpendicular to the sensitive axis, symmetrically and on either side of the coil arrangement, in each case a coil-free region with a width that is at least 10% of a width of an (in particular internal) opening of the first shielding element may be provided adjacent to the first shielding element. Without said distance or with a distance that is too small, the shielding element would greatly reduce the efficiency of excitation as well as the inducible voltage of the receiving coil. In particular, the same or a similar spacing from the first shielding element may be provided on all sides of the coil arrangement.

In one embodiment, the exciting coil may substantially be excitable with a periodic, in particular a substantially sinusoidal, current or a periodic, in particular a substantially sinusoidal, voltage, so that an alternating magnetic field can develop in the exciting coil, which can act on the object. The excitation of the exciting coil may be carried out by means of an oscillating circuit of the sensor electronics, in particular an LC oscillating circuit. In other words, in one embodiment the exciting coil may be part of an oscillating circuit. In one embodiment, the exciting coil may, as an inductive element of an LC circuit, be a part of the self-oscillating LC oscillating circuit, so that the exciting coil, together with a capacitor that can act as the capacitive element of the LC circuit, can form the resonant circuit.

In one embodiment, the at least one parameter determined from the at least one electrical signal, e.g., from the current or from the voltage, of the exciting coil may be for example, but not exclusively, a frequency or an amplitude of the respective electrical signal. These types of the parameter may be sensitive to the distance, so that the exciting coil can function as part of a distance sensor.

In one embodiment, the sensor electronics may be configured to calculate, from the changes of the determinable parameter of the electrical signal of the exciting coil caused by the presence of the object, a (particularly dimensionless) proximity signal, which is indicative of the change of the at least one parameter caused by the presence of the object. The proximity signal may in particular be defined as $a*(U_{D0}-U_D)$ or $b*(f_{OSC0}-f_{OSC})$ or $a*(U_{D0}-U_D)+b*(f_{OSC0}-f_{OSC})$. In the foregoing, a, b may denote scaling factors and $U_{D0}$ and $f_{OSC0}$ may denote an object-free value of the amplitude $U_D$ of the demodulation voltage or of the oscillation frequency $f_{OSC}$.

Moreover, the proximity signal may also be dependent on the longitudinal or lateral position.

In one embodiment, the sensor device may be configured to determine, from an electrical signal of the exciting coil, at least one reference signal, whose phase may have a predetermined ratio to a phase of the electrical signal of the exciting coil.

In a first option, the sensor electronics may be configured for determining the at least one parameter of the inducible voltage by means of a synchronous demodulation from the inducible voltage using the reference signal. The at least one parameter may then be an amplitude of a phase-sensitive demodulated inducible voltage, and the phase of the phase-related phase reference signal may have a predetermined relationship with the phase of an electrical signal of the exciting coil.

In a second option, the sensor electronics may be configured to determine the at least one parameter of the inducible voltage by quadrature demodulation of the inducible voltage using the reference signal. The at least one parameter of the inducible voltage may then be a phase-related amplitude of a quadrature-demodulated inducible voltage.

These embodiments of the signal processing for obtaining the at least one parameter make it possible to use conventional techniques for continuous demodulation of the inducible voltage and may contribute to a quick response time of the sensor device.

In one embodiment, the sensor electronics may be configured to determine a (particularly dimensionless) longitudinal position signal from the at least one parameter of the inducible voltage and optionally the lateral position and optionally the distance. The longitudinal position signal may then be based on the at least one parameter of the inducible voltage of the receiving coil. In this connection, the at least one parameter may be a phase-related amplitude of a quadrature-demodulated inducible voltage, provided in particular that synchronous demodulation can be used for determining the at least one parameter. The at least one parameter may also be an in-phase component and a quadrature-phase component of the amplified inducible voltage, provided in particular that quadrature demodulation can be used for determining the at least one parameter. The longitudinal position signal may in particular be defined as $S_P=c*U_I$, $S_P=d*U_Q$, $S_P=C*U_I+d*U_Q$, $S_P=e*U_\varphi$, and a, b, c, d and e denote scaling factors. $U_\varphi$ denotes the phase-related amplitude of a quadrature-demodulated inducible voltage. $U_I$ denotes the in-phase component and $U_Q$ the quadrature-phase component of the amplified inducible voltage.

In one embodiment, the sensor electronics may be configured to determine a reduced longitudinal position signal as the ratio of the longitudinal position signal and the proximity signal, in order to determine the longitudinal position from the reduced longitudinal position signal. In particular, the reduced longitudinal position signal $V_M$ may be calculated as $V_M=S_P/S_N$.

In one embodiment, the sensor device may be configured to determine the longitudinal position from the reduced longitudinal position signal by means of a linearization function, to ensure a more precise position determination.

The first variant of the method of evaluation, in which the reduced longitudinal position signal is determined, may thus be based on dividing the synchronous-demodulated or the quadrature-demodulated voltage by the proximity signal, so that the resultant signal may be less dependent on the distance of the object in contrast to the corresponding voltage. The resultant signal may additionally be dependent on the longitudinal or lateral position of the object, and can be converted to the longitudinal or lateral position by linearization and scaling.

In one embodiment, the sensor device may, in a second variant of the method of evaluation, be configured to determine a mechanical phase as arctan 2 from the reduced longitudinal position signal and the proximity signal multiplied by a scaling factor determined in a preceding learning process, in order to determine the longitudinal position and optionally the lateral position and optionally the distance, from the mechanical phase. In particular, arctan 2 ($V_M$, $B*S_N$) may be calculated. In the foregoing, B denotes the scaling factor.

The scaling factor can ensure that the arctan 2 function can represent a monotonic property over a certain range of the movement of the object. The scaling factor may either be established beforehand for example at the factory, if it is known at what vertical distance an object will probably move with what predetermined properties. Alternatively or additionally, the scaling factor may be determined by means of the learning process, in which the object can at least move e.g. through the middle of the sensing range of the sensor device and the magnitude or the order of magnitude of the proximity signal can thus be determined for the current time and from this time point at constant vertical distance of the object. It can be assumed for the calculation that both arguments of the arctan 2 function can be provided as dimensionless values. Since the current or voltage signals are digitalized by A/D converters, the oscillation frequency can be measured by a microcontroller and provision of the dimensionless values will not require any special measures.

In one embodiment, the sensor device may be configured to linearize the mechanical phase (for example by means of a linearization function), and then determine the longitudinal position from the linearized mechanical phase and thereby ensure a more precise position determination.

In addition, the proximity signal can be used for determining the distance. It should be pointed out that the proximity signal depends not only on the distance, but also on the material properties and geometric properties (e.g., width) of the object. For example, in the presence of a small object, a smaller proximity signal may be produced than in the presence of a large object under the same conditions.

In an alternative embodiment, the linearization may be carried out as a function of the type of material of the object.

In an alternative embodiment, the sensor electronics may be configured to determine the type of material of the object based on the at least one parameter of an electrical signal of the exciting coil or the at least one parameter of the inducible voltage. In particular, the sensor electronics may be configured to determine the type of material of the object based on a typical phase of the voltage inducible by the object in the receiving coil relative to the phase of an electrical signal of the exciting coil. A typical phase may be defined in a period of time as the most frequently occurring phase value (or mean value) of the inducible voltage. Moreover, it can be assumed that the determination of the phase cannot be prevented by amplitudes that are too narrow. It may be necessary to take into account that the sign of the inducible voltage also depends on the object position, and a corresponding phase shift can be corrected before determining the mean value. Alternatively or additionally, the sensor electronics may be configured to determine a type of the object material of the object based on a typical relationship between the amplitude change caused by the presence of the object and frequency change of the oscillator voltage. With a known object material, one of the aforementioned two variants of evaluation and an optional, suitable linearization method may then be used to make a very precise position determination possible. For example, the use of the oscillation frequency change as opposed to the demodulation voltage change may have the advantage that aluminium-containing objects can be detected particularly well, as such objects may cause slight changes of the demodulation voltage. It is also possible that the object material can be identified because the typical value of the relationship between the amplitude change and the frequency change of the oscillator voltage is known for the different materials and can be compared with the measured value. This value may be assumed to be constant and known, regardless of the position. As the characteristic of the respective position-dependent relationship of the reduced longitudinal position signal may be non-linear, a material-dependent linearization may be carried out. This may be obtained by using an inverse function of the characteristic and may be defined for example by an interpolatable lookup table, a polynomial or some other analytical approximation function, whose content, coefficients or parameters may be the parameters of the evaluation algorithm.

A learning process for the movement of the object may be carried out in a certain movement range (e.g., a reference trip or installation trip), before the position(s) and optionally the distance are determined. The sensor device can acquire, store and/or process measuring data for determining the object material.

A multi-variant non-linear function, for example an artificial neural network, can be used instead of the two variants of the method of evaluation described above. The training of the neural network may require a prior learning process, which may be specific for the type of sensor and/or the environment of the sensor. The training can be carried out at the factory at the sensor design stage and/or during production of the sensor. An input variable of the function may be the at least one parameter of the electrical signal of the exciting coil and the at least one parameter of the inducible voltage, and an output variable of the function may be the longitudinal position and optionally the distance and optionally the lateral position of the object.

In one embodiment, the sensor electronics may implement a self-parameterizing evaluation algorithm.

In one embodiment, the sensor electronics may be configured to parameterize an evaluation algorithm self-adaptively, determine a type of the object material of the object self-adaptively and/or recognize a change of a measuring arrangement self-adaptively.

In one embodiment, the sensor electronics may be configured to determine and temporarily or permanently store one or more values of the at least one parameter, for self-adaptive parameterization of the evaluation algorithm.

Through all these measures, the process time in position determination and optionally in distance determination can be reduced.

The object may be moved at one or more fixed vertical distances relative to the sensor device, and (self) calibration of the sensor device with respect to the combination of the vertical distance and the associated longitudinal position of the object can be carried out. As a result, the position determination can be simplified, the accuracy of the position determination can be improved and/or a malfunction of the sensor device can be compensated.

The calibration can be carried out before actual distance determination. For example, a movement of the object along a fixed trajectory, for example at a fixed object distance or a fixed longitudinal position, over an extended period depending on the application, for example during two maintenance time points, or also viewed over the sensor lifetime, can be determined. In this case, the sensor device may carry out its self-calibration, in which the trajectory of the object can be determined as a combination of the vertical distance and the longitudinal position. All combinations determined for the vertical distance and the longitudinal position for the trajectory of the object can be described by a position-dependent, e.g., a linear, function, which can be determined in the calibration process. In the case of an actual position determination, the joint determination of the vertical distance and of the longitudinal position can be reduced to determination of one of these two quantities, in particular the longitudinal position. Furthermore, if there is a significant deviation from the trajectory, a maintenance signal can be emitted, or it is possible to go back to the calibration function.

Alternatively or additionally, the calibration may be carried out when the sensor device is commissioned and an actual position determination is carried out. A function determined in the course of operation, which may depend on the combination of the vertical distance and the longitudinal position, may be used in order to increase the accuracy of the position determination, wherein the function is used in a renewed position determination and the position determined is compared against the values of the function, and if there are deviations the position can optionally be determined again from the acquired measuring signals.

According to a second aspect, a method is provided for operating an inductive sensor device for determining a longitudinal position of a object, which is moveable at a distance from an end face of the sensor device and which is at least partially electrically conductive and/or magnetically polarizable along a sensitive axis of the sensor device, wherein the method comprises producing an alternating magnetic field of a substantially planar exciting coil of a coil arrangement of the sensor device for inducing eddy currents and/or magnetic polarization in the object, determining, by means of sensor electronics of the sensor device, at least one parameter of an electrical signal of the exciting coil, which is altered by an inductive backward effect of the object, and at least one parameter of a voltage induced in a first receiving coil of the coil arrangement owing to the inductive backward effect of the object, wherein the first receiving coil is of substantially planar configuration and is arranged substantially parallel to and overlapping the exciting coil, wherein the exciting coil and the first receiving coil are arranged substantially parallel to the end face of the sensor device, and determining, by means of the sensor electronics, the longitudinal position based on the at least one parameter of the electrical signal of the exciting coil and the at least one parameter of the induced voltage of the first receiving coil.

According to a third aspect, a program is provided for data processing equipment, in particular for the sensor electronics of the sensor device according to the first aspect, which is configured to carry out steps of a method according to the second aspect, if it is carried out by the data processing equipment. The program may have instructions and form a control code that comprises an algorithm for carrying out the method.

The sensor electronics may comprise at least one programmable component, e.g., a microcontroller, and at least one non-volatile memory, in which a program of an algorithm for carrying out the method according to the second aspect and optionally the parameters of the algorithm are stored. The program may for example be the program according to the third aspect.

BRIEF DESCRIPTION OF THE DRAWINGS

Other objects and features of the invention will become apparent from the following detailed description considered in connection with the accompanying drawings. It is to be understood, however, that the drawings are designed as an illustration only and not as a definition of the limits of the invention.

In the drawings,

FIG. 1 shows schematically a sensor device and an object in accordance with embodiment examples;

FIGS. 2A-2C show an embodiment example of a coil system and a shielding element of the sensor device in FIG. 1 in an exploded view, in a perspective view and in a sectional view;

FIGS. 3A, 3B show a further embodiment example of the sensor device in FIG. 1 in an exploded view and in a sectional view;

FIGS. 4A-4D show an implementation of an exciting coil and a first receiving coil of the sensor device in FIGS. 3A, 3B;

FIG. 5 shows schematically an arrangement of a coil arrangement of the sensor device 10 in FIG. 1 inside a first shielding element of the sensor device;

FIGS. 6A-6B show a coil arrangement for a further embodiment example of the sensor device in FIG. 1 in an exploded view, in perspective view and in a top view;

FIG. 7 shows a schematic view of the sensor electronics of the sensor device in FIG. 1, which is connected electrically to the exciting coil and the receiving coil of the sensor device in FIG. 2, FIG. 3 or FIG. 6;

FIGS. 11A-11E show diagrams which show a demodulation voltage, a proximity signal, a quadrature-phase component of the voltage induced in the receiving coil, a relationship between the quadrature-phase component and the proximity signal, and the mechanical phase as a function of a longitudinal object position for different object distances.

DETAILED DESCRIPTION OF PREFERRED EMBODIMENTS

Figure 4A:
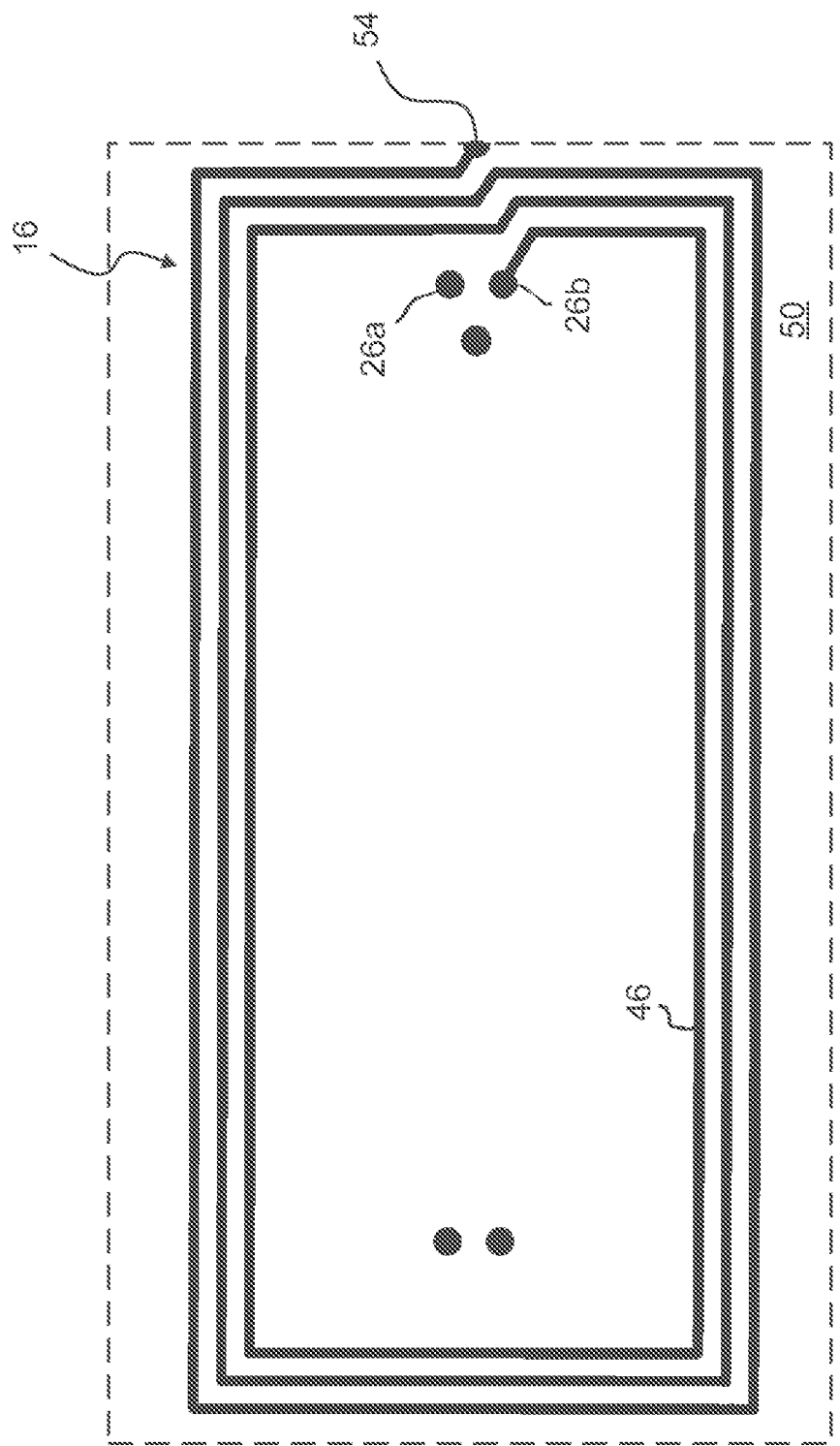

Identical or similar components or elements are designated with the same reference symbol.

FIG. 1 shows a sensor device 10 in accordance with embodiment examples, which is configured for determining a longitudinal position of a moveable object 11 along a first sensitive axis S1 of the sensor device 10. The object 11 is moveable along a trajectory at a vertical distance from an end face 12 of the sensor device 10. The distance D is measured between the end face 12 of the sensor device 10 and a surface 13 of the object 11 facing the sensor device 10. The sensor device 10 may further optionally be configured for determining a position L along a second sensitive axis S2, which extends perpendicularly to the first sensitive axis S1. The first and the second sensitive axis S1, S2 are oriented perpendicular to one another. The sensor device 10 may additionally optionally be configured for determining the distance D.

The sensor device 10 is made with a coil arrangement and optionally a shield made of electrically conductive material, for example metal, which are illustrated in FIGS. 2A to 6B. The coil arrangement and the shield are arranged on a side of the end face of the sensor device 10 that is directed away from the object 11.

As shown in FIGS. 2A-2C, in a first embodiment example the sensor device 10 has the coil arrangement 14, which has a planar, rectangular exciting coil 16 and a planar, butterfly-shaped receiving coil 18, both of which are configured as wound wire conductor loops and are overlapping. Opposite winding segments 20a, 20b of the receiving coil 18, which are oriented along the sensitive axis S1, are crossed in the middle of a coil, so that the receiving coil 18 is configured as a butterfly coil and coil segments 21a, 21b, i.e., half-coils 21a, 21b, are anti-symmetrically polarizable. A first shielding element 22a of the shield 22 surrounds the coil arrangement 14 on all sides. The receiving coil 18 is arranged with its surface extension in its coil plane parallel to the rectangular surface of the exciting coil 16 and directed towards the end face 12 of the sensor device 10 and therefore to the end face 13 of the object 11. The exciting coil 16, the receiving coil 18 and the first shielding element 22a form a "head" of the sensor device 10. Alternatively, the exciting coil 16 may also be arranged towards the end face 12 of the sensor device 10 and therefore towards the end face 13 of the object 11, or the exciting coil 16 may surround the receiving coil 18 substantially in its own coil plane, or both coils 16, 18 may be wound on the same coil former (not shown).

As shown in FIG. 2C, a printed-circuit board 24 is arranged on a side of the first shielding element 22a turned away from the end face 12. Connections 26a, 26b of the exciting coil 16 and connections 28a, 28b of the receiving coil 18 are connected electrically to the printed-circuit board 24. Sensor electronics 30 are arranged on the side of the printed-circuit board 24 turned away from the coil arrangement 14. Alternatively, this surface may only have soldering points for contacting to the sensor electronics provided on a further printed-circuit board. A second shielding element 22b of the shield 22 may optionally be configured as a layer of copper on at least one layer of the printed-circuit board 24. The shielding element 22a and, if present, the shielding element 22b, the exciting coil 16, the receiving coil 18 and the sensor electronics 30 are enclosed in a housing 34. A connecting cable 36 extends through the housing 34 to the outside and is connectable to a power supply. The connecting cable 36 may furthermore comprise leads for one or more output signals. The end face 12 of the sensor device 10 corresponds to an end face of the housing 34 that is directed towards the object 11.

The sensor device 10 according to a second embodiment example, shown in FIGS. 3A, 3B, is configured in printed-circuit board technology, i.e., as a multilayer printed-circuit board 38. The coils 16, 18a, 18b are depicted as rectangular surface regions (FIG. 3A) or as a dotted line (FIG. 3B). For clarity, windings of the coils 16, 18a, 18b are not shown. A planar, rectangular exciting coil 16 and a first and second planar, rectangular receiving coil 18a, 18b are made overlapping in mutually parallel printed-circuit board layers. Viewed along the axis S1, the first and second receiving coil 18a, 18b have in each case oppositely directed windings. Coil segments 21a, 21b of the first receiving coil 18a and coil segments 40a, 40b of the second receiving coil 18b overlap, so that the coil segments 40a or 40b are parallel to an edge region of the coil segments 21a or 30b. Polarization of the coil segments 21a, 40a and of the coil segments 21b, 40b is the same in each case and is designated with "+" or "−". In other words, the receiving coils 18a, 18b are of anti-symmetrically polarizable configuration. The first and second receiving coil 18a, 18b are connected electrically in series, and in circuit engineering terms may be treated electrically as a single receiving coil.

A first shielding element 22a of the shield 22 is made as a layer of metal on an internal surface of a housing 34 of the sensor device 10. The metal layer surrounds the coil arrangement 14 completely. A second shielding element 22b of the shield 22 is configured as a metallization layer between the layers of the coil arrangement 16, 18a, 18b and the layers of the sensor electronics 30. The exciting coil 16, the receiving coils 18a, 18b and the shielding elements 22a, 22b form a "head" of the sensor device 10. The end face 12 of the sensor device 10 corresponds to an end face of the housing 34 that is directed towards the object 11. Sensor electronics 30 have a first and second printed-circuit board layer 42, 44, on or in which one or more circuits and/or logic components for excitation of the receiving coil 16 and signal conditioning and signal processing of a signal or several signals of the exciting coil 16 and the first and second receiving coil 18a, 18b are mounted.

Figure 4B:
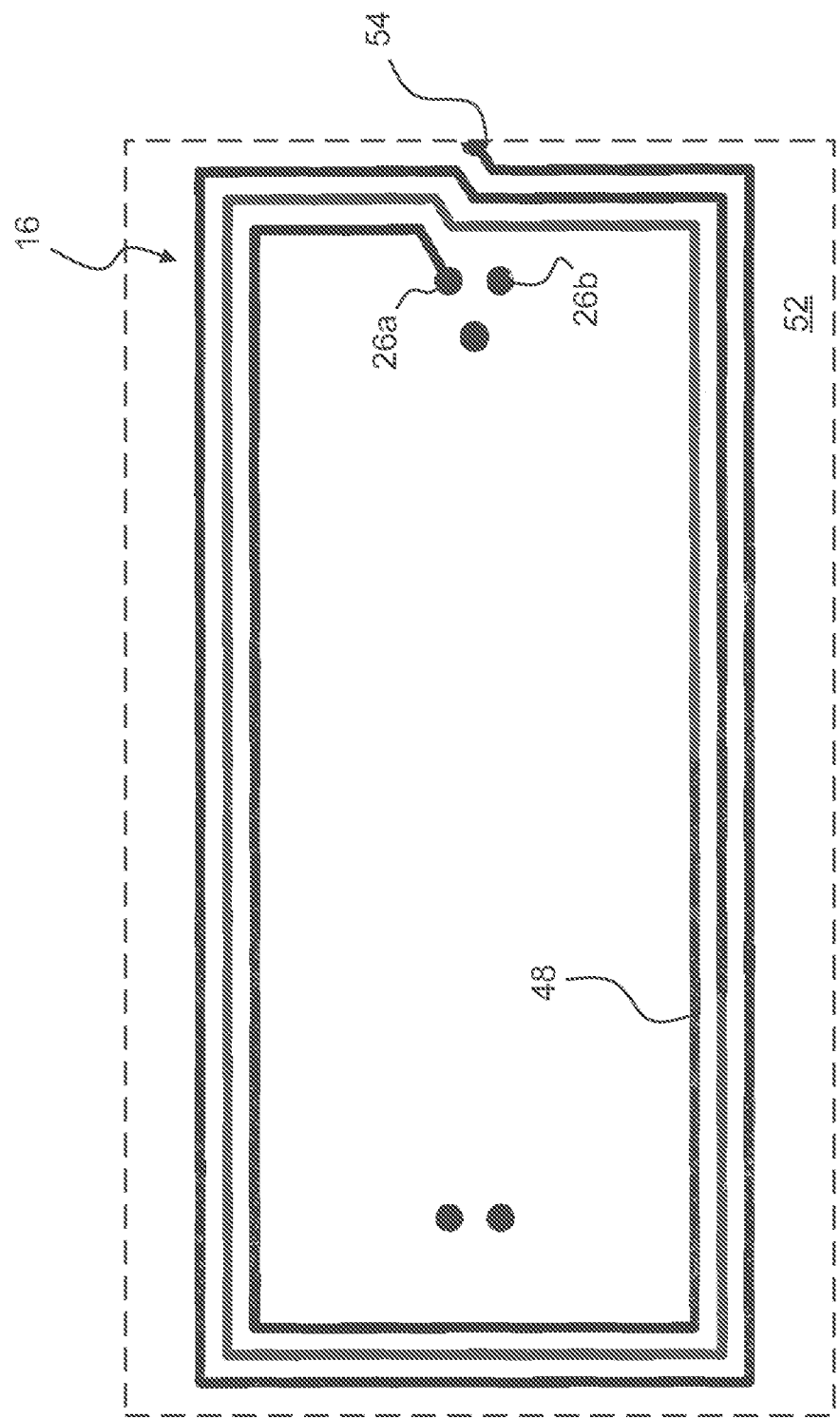
Figure 4C:
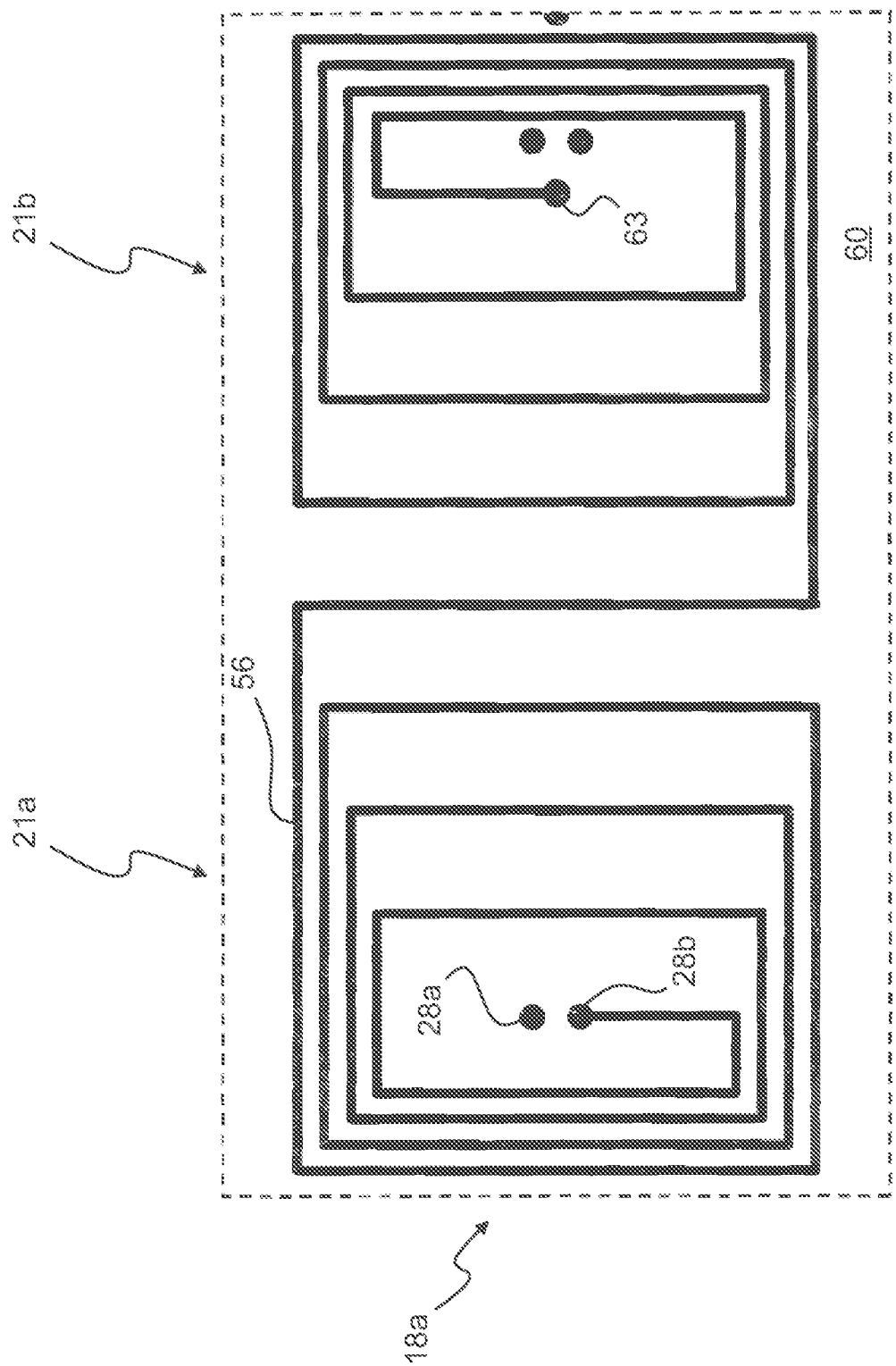

FIGS. 4A-4D show an implementation of the coil arrangement 14 in FIGS. 3A-3C. The exciting coil 16 shown in FIGS. 4A, 4B is arranged in two superposed layers 46, 48 of the printed-circuit board 38, the edges of which are shown as dashed lines. Windings 46 or 48 of the exciting coil 14 in the two layers 50 or 52 are in each case connected together by means of a via hole 54. Windings 56 and 58 of the receiving coil 18a or 18b are formed by circuit-board conductors in two layers 60 or 62 of the printed-circuit board 24 and are connected together with a via hole 63. On both layers 60, 62, the windings 56, 58 of the coil segments 21a or 40a and 21b or 40b are in each case configured in opposition, whereas the windings 56, 58 of the coil segments 21a, 21b and 40a, 40b shown in the drawing plane both on the left and on the right are directed in the same direction on both layers 60, 62. Connections 26a, 26b of the receiving coil 16 and connections 28a, 28b of the first and second receiving coil 18a, 18b for connecting to sensor electronics are in each case configured as via holes, onto which leads for the sensor electronics may also be soldered.

FIG. 5 shows a top view of the coil arrangement 14, which is arranged within the first shielding element 22a. The coil arrangement 14 may for example be one of the coil arrangements 14 in FIGS. 2A-2C, 3A, 3B. The coil arrangement 14 is spaced away from the lateral shielding element 22a so that there is a distance d between a region in which the coil arrangement 14 extends, and the lateral shielding element 22a, which is at least 10% of the width b of an internal opening 64 of the first shielding element 22a, measured perpendicularly to the sensitive axis A1, and a corresponding coil-free region 66 is formed.

FIGS. 6A, 6B show a coil arrangement 14 for a sensor device 10 according to a fourth embodiment example, which is configured similarly to the coil arrangement in FIGS. 3A, 3B. Coils 16, 18a, 18b of the coil arrangement 14 are depicted as rectangular surface regions. For clarity, windings of the coils 16, 18, 68a, 68b are not shown. However, a second receiving coil 68a, turned through 90 degrees to the first receiving coil 18, is arranged so that the sensor device 10 has two sensitive axes S1, S2 instead of one sensitive axis S1. Half-coils of the receiving coil 68a have the reference symbols 69a, 69b. The receiving coil 18 may for example be configured like the coils 18a, 18b in FIGS. 3A, 3B. The sensor device 10 is therefore configured for determining the longitudinal position P of the object 11 along the sensitive axis S1 and the lateral position L of the object 11 along the sensitive axis S2. Moreover, all coils 16, 18, 68a, 68b have a square cross-section. A coil-free region 66 between a first shielding element 22a and the coil arrangement 14 is therefore provided adjacent to edges of the respective coil 16, 18, 68a, 68b. A distance d may be selected, as shown in FIG. 5. A second shielding element (not shown) and the printed-circuit boards of the sensor electronics are of rectangular configuration. The first and second receiving coils 18a, 68a are connected electrically independently of one another.

The coil arrangement 14 may, just as in FIGS. 3A, 3B, further comprise an additional receiving coil in the end region of the first receiving coil 18 and an additional receiving coil in the end region of the receiving coil 68a, which in each case increase the sensitivity in the end region of the respective receiving coil 18, 68a.

The sensor electronics 30 shown in FIG. 7 have an oscillation unit 70, which is connected electrically via a capacitor 71 to the exciting coil 16 from FIGS. 2A-2C, FIGS. 3A, 3B or FIG. 6A-6B. A demodulation unit 72 of the sensor electronics 30 in the form of a demodulator is connected electrically to the receiving coil(s) 18, 68a, 68b of the coil arrangement 14. Since the coils 18a and 18b are connected in series, and electrically do not have to be connected separately to the electronic circuit of the demodulation unit 72, in the following the receiving coil for the longitudinal sensitive axis S1 is designated, with reference to FIGS. 7-9, as the receiving coil 18.

Moreover, an evaluation unit 74 is coupled to the oscillation unit 70 and the demodulation unit 72.

The oscillation unit 70 is configured for determining and emitting, from an electrical signal of the exciting coil 16, which is either a voltage or a current, a first parameter DSS that is indicative of the presence of the object 11 in the vicinity of the coil arrangement 14, in particular in a fixed longitudinal position, at a vertical distance D between the sensor end face 12 and the object 11. The first parameter DSS further depends on the longitudinal position P and, if a lateral displacement of the object 11 is possible, on the lateral position L of the object 11. It is also possible for the oscillation unit 70 to be configured so that not one, but several signal parameters are determined from the electrical signal of the exciting coil 16 and emitted. In this case DSS denotes a first group of the parameters. The oscillation unit 70 is further configured to determine a reference signal PHA, whose phase is in a predetermined relationship with a phase of the voltage or the current in the exciting coil 16, and to output it to the demodulation unit 72.

The demodulation unit 72 is configured to determine a second parameter PSS from the voltage induced in the receiving coil 18 and output it to the evaluation unit 74. The second parameter PSS depends moreover on the distance D, and, provided a lateral displacement of the object 11 is possible, on the lateral position L of the object 11. The demodulation unit 72 is configured to determine the parameter PSS on the basis of the reference signal PHA. The demodulation unit 72 may also be configured so that not one, but several signal parameters are determined from the induced voltage of the receiving coil 18, and are output. In this case PSS denotes a second group of the parameters.

The evaluation unit 74 is configured for jointly evaluating the first and second parameters DSS, PSS or the first and second group of parameters DSS, PSS and for determining the longitudinal position P of the object 11 and optionally the vertical distance D of the object 11.

It is noted that for making a second sensitive axis S2 through the receiving coils 68a, 68b in FIGS. 6A-6B and for determining a third parameter LSS (not shown), either a second demodulation unit is necessary, or the first demodulation unit 72 is usable for demodulating the voltage of both receiving coils 18, 68a in time-division multiplex operation. The third parameter LSS is determinable from the induced voltage of the third receiving coil 68a similarly to the parameter PSS from the induced voltage of the receiving coil 18, and is processable for determining the lateral position L similarly to the first parameter PSS for determining the longitudinal position P.

Figure 8:
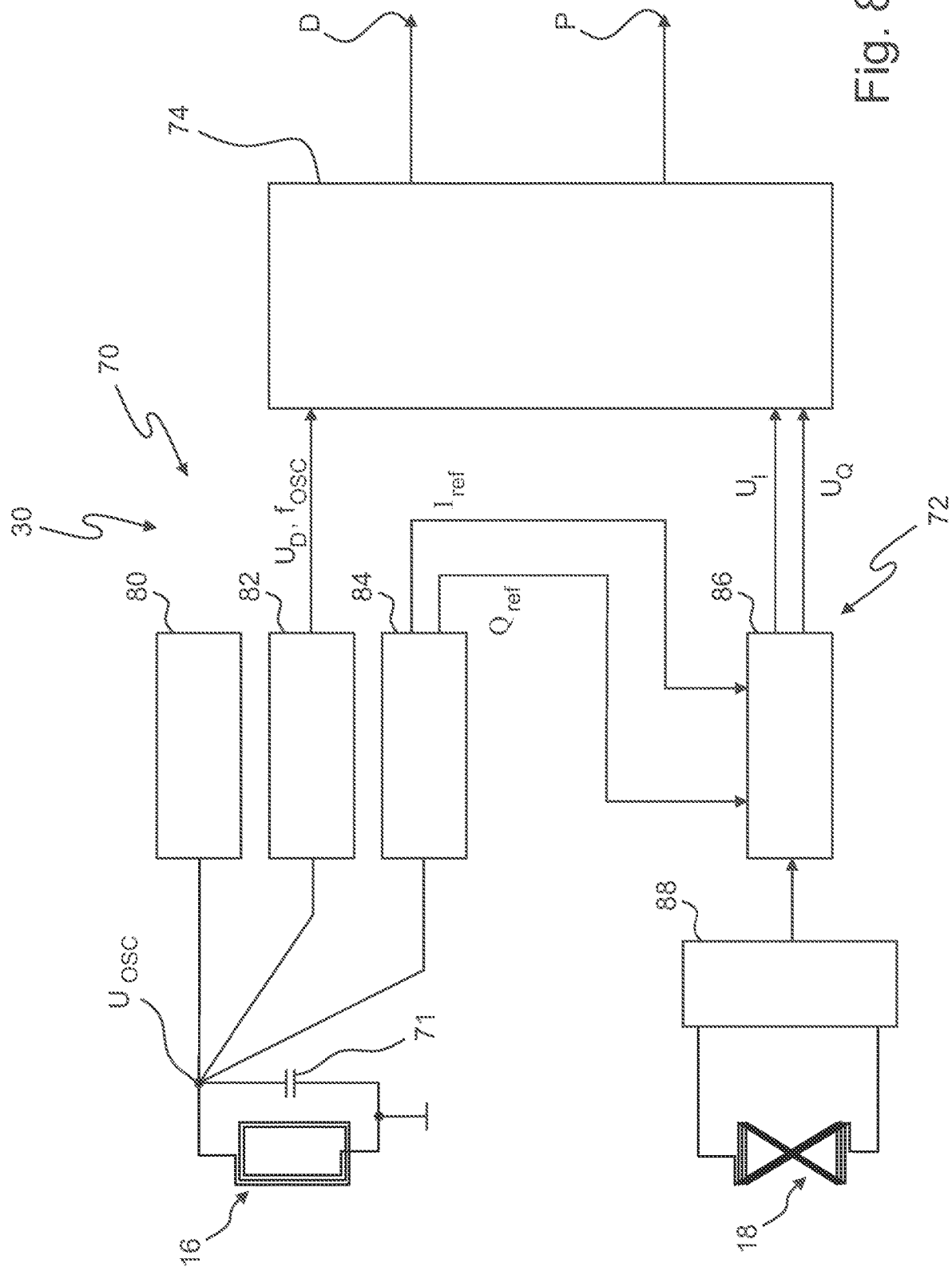
FIG. 8 shows an embodiment example of the sensor electronics in FIG. 7.

In the first embodiment example of the sensor electronics 30 shown in FIG. 8, the oscillation unit 70 is formed as oscillation circuit 80 in FIG. 7, which is configured for supplying energy to the exciting coil 16 so that the exciting coil 16 is operable self-oscillating as inductive element of an LC circuit and the capacitor 71 is operable self-oscillating as capacitive element of the LC circuit. A demodulator 82 of the oscillation unit 70 is formed as a circuit and is configured, as amplitude detector of the oscillator voltage $U_{OSC}$, to output a demodulation voltage $U_D$ that is characteristic of the oscillator amplitude, and/or as frequency detector, to output an oscillation frequency $f_{OSC}$ of the oscillator voltage $U_{OSC}$ as the first parameter or the first group of parameters DSS. Moreover, there is a linear relationship between the demodulation voltage and the oscillator amplitude. It is also possible for an oscillator current to be used instead of the oscillator voltage $U_{OSC}$, and for the demodulation voltage $U_D$ to be replaced with another that characterizes the amplitude of the oscillator current. The demodulator 82 is in this case also configured as amplitude detector. Alternatively, the demodulator 82 may be configured as frequency detector of an oscillation frequency of the oscillator current.

A quadrature-phase detector 84 of the oscillation unit 70 is formed as a circuit and is configured to output binary signals, i.e., square-wave signals, $I_{ref}$, $Q_{ref}$ which correspond to an in-phase reference signal $I_{ref}$ or a quadrature phase reference signal $Q_{ref}$ with respect to a phase of the oscillator voltage $U_{OSC}$. These two signals $I_{ref}$, $Q_{ref}$ together form the reference signal PHA.

The demodulation unit 72 is configured as a phase-sensitive demodulator 86, which, using $I_{ref}$, $Q_{ref}$ performs a quadrature demodulation, and has a corresponding circuit. One input signal of the demodulator 86 is the voltage induced in the receiving coil 18, which is amplified by an amplifier 88. A further input signal of the phase-sensitive demodulator 86 is the output signal of the quadrature-phase detector 64, namely $I_{ref}$, $Q_{ref}$. One output signal of the demodulator 86 is the second parameter PSS or the second group of parameters PSS, which represents a demodulated voltage. The demodulated voltage may either have two components, namely an in-phase component $U_I$ and quadrature-phase component $U_Q$, of the amplified induced voltage.

Figure 9:
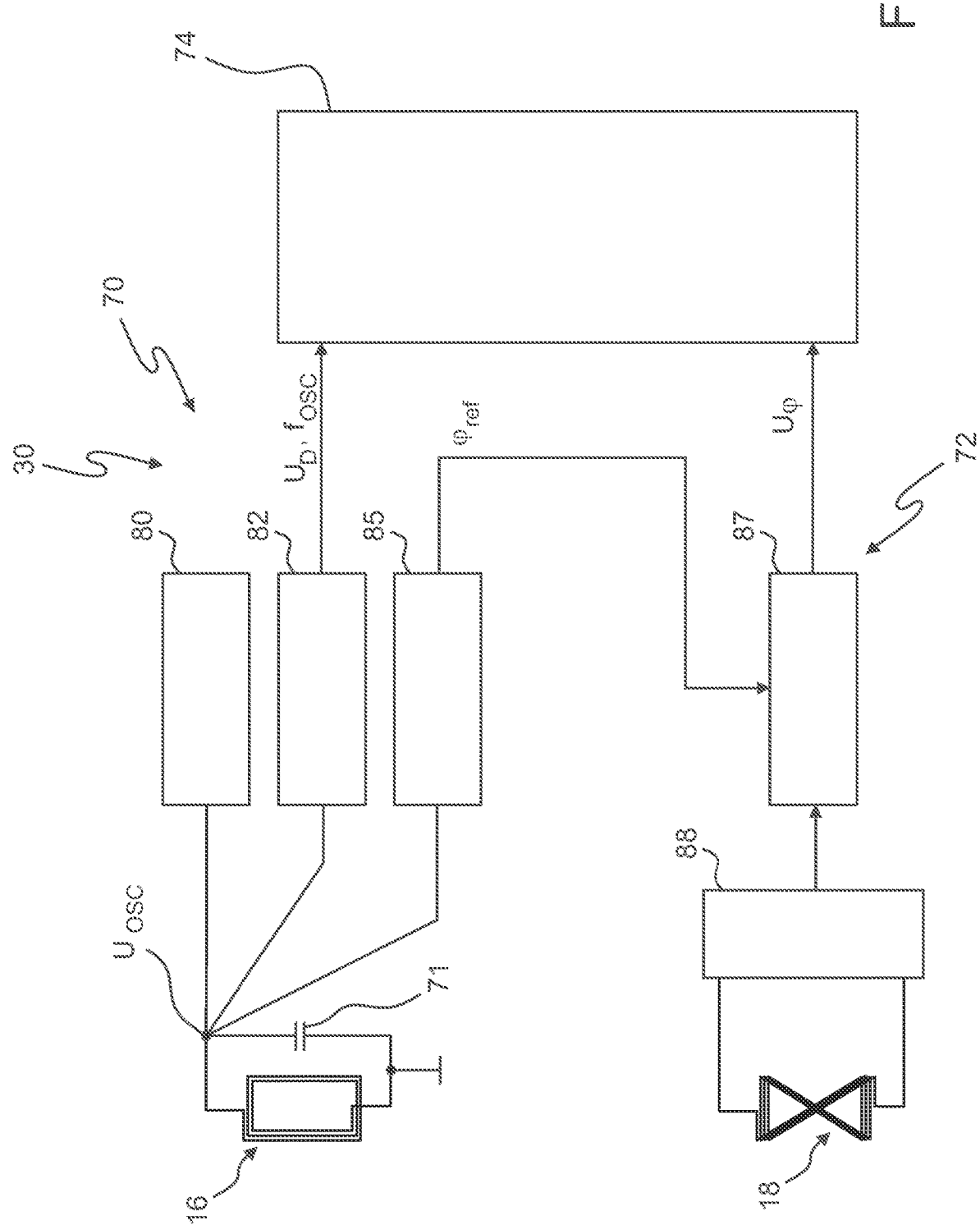
FIG. 9 shows a further embodiment example of the sensor electronics in FIG. 7.

The second embodiment example of the sensor electronics 30 shown in FIG. 9 is configured in FIG. 7 similarly to the sensor electronics in FIG. 8. However, the quadrature-phase detector 84 is configured as phase detector 85, whose output signal is a phase reference signal $\varphi_{ref}$, which has a predetermined relationship with the phase of the oscillator voltage $U_{OSC}$. Instead of the two-channel phase-sensitive demodulator 86, a phase-sensitive demodulator 87 is provided, which performs a synchronous demodulation using the phase reference signal $\varphi_{ref}$ and instead of the in-phase or the quadrature-phase component $U_I$, $U_Q$, outputs a phase-related amplitude $U_\varphi$ as the second parameter PSS.

In operation of the sensor device 10, the oscillation circuit 70 of the sensor device 10 is supplied with a sinusoidal current. A magnetic field forms in the exciting coil 16, producing eddy currents and magnetic polarization in the object 11. Owing to the backward effect of the object 11 on the exciting coil 16, an electrical signal in the exciting coil 16 is altered. Additionally, owing to the backward effect of the object 11, a voltage is induced in the receiving coils 18, 68a, 68b. The first parameter DSS or the first group DSS and the phase reference signal PHA are determined by means of the oscillation unit 70. The phase reference signal PHA is output to the demodulation unit 72, which determines, using the phase reference signal PHA, a second parameter PSS from the amplified induced voltage of the receiving coil 18 and optionally a third parameter LSS from the amplified induced voltage of the receiving coils 68a, 68b. The signal DSS and the signal PSS, LSS are output to the evaluation unit 74.

For determining the position P and the distance D, an algorithm implemented in the evaluation unit 74 of the sensor electronics 30 is executed, with which a dimensionless proximity signal $S_N$ is formed from the first parameter DSS. The proximity signal $S_N$ may be defined in particular as $S_N = a(U_{D0} - U_D)$ or $S_N = b(f_{OSC0} - f_{OSC})$ or $S_N = a(U_{D0} - U_D) + b(f_{OSC0} - f_{OSC})$. In the foregoing, a and b denote scaling factors, and $U_{D0}$ and $f_{OSC0}$ denote the object-free value of the demodulation voltage $U_D$ and the oscillation frequency $f_{OSC}$ in each case.

Furthermore, a dimensionless longitudinal position signal $S_P$ is formed from the second parameter PSS, which is determined in particular as $S_P = c*U_I$, $S_P = d*U_Q$, $S_P = c*U_I + d*U_Q$, $S_P = e*U_\varphi$ with scaling factors c, d and e. It is assumed that a possible background signal of the voltages $U_I$, $U_Q$ or $U_\varphi$ has already been subtracted at this point.

A reduced longitudinal position signal $V_P$ is then formed as a relationship between the longitudinal position signal $S_P$ and the proximity signal $S_N$ in the form $V_P = S_P / S_N$.

Additionally, a mechanical phase $P_M$ may optionally be formed by an arctan 2-function, defined as $P_M = \arctan 2(V_P, B*S_N)$ with a scaling factor B.

The ratio $V_P$ and the mechanical phase $P_M$ may further optionally be scaled and linearized, in order to determine the longitudinal position P.

The scaling factor B may either be established beforehand, for example at the factory, if it is known at what vertical distance D the object 11 is expected to move. Alternatively or additionally, B may have been determined by means of a learning process, carried out before the method, in which the object 11 moves at least through the middle of the longitudinal measuring range of the sensor device 10 and an absolute quantity $S_{NL}$ is detected from the proximity signal $S_N$, for example its maximum value, or its value at the point where the longitudinal position signal $V_P$ is zero. B may be inversely proportional to $S_{NL}$, i.e., $B = k/S_{NL}$, wherein k is a further scaling factor, with the result that the arctan 2 function represents a monotonic function, in particular a property that is as linear as possible over a certain range of the movement of the object.

As both the variation of the oscillation parameter, and therefore the proximity signal $S_N$, as well as the induced voltage of the receiving coils 18, and therefore the longitudinal position signal $S_P$ are determined by the inductive backward effect of the same object 11, the reduced longitudinal position signal $V_P$ is "relatively" independent of the distance D. The precondition for position determination by calculating the mechanical phase $P_M$ is that the distance D between the object 11 and the end face 12 of the sensor device 10 does not deviate markedly from the distance at which the scaling factor B was determined.

For determining the lateral position L, the third parameter LSS, instead of PSS, may be examined and evaluated in exactly the same way.

For determining the distance, a prior calibration of the sensor device with respect to the longitudinal position P and optionally the lateral position L may be carried out for various distances D.

In a further method of evaluation, which can be implemented by the evaluation unit 74, it is possible to use a multi-variant, non-linear function of one or more of the aforementioned parameters DSS, PSS and LSS. For example, an artificial neural network may be used, which has previously been trained to determine the position P and optionally the lateral position L and/or optionally the distance D. The training of the artificial neural network may necessitate a prior learning process, which is carried out either for the type of sensor device 10 (for example for its size or its design) or for the environment of the sensor device in which it is used, for example at the factory at the design stage or individual production thereof.

Figure 10:
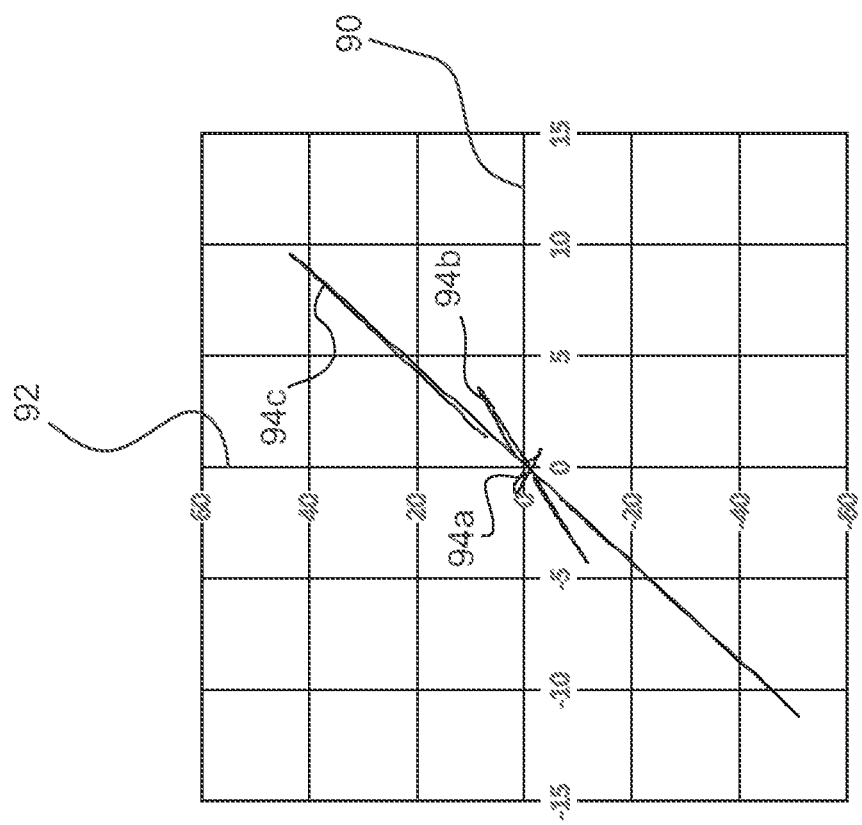
FIG. 10 shows schematically a correlation between a quadrature-phase component and an in-phase component of a voltage induced in the receiving coil.

FIG. 10 shows for example the relationship for the correlation between $U_I$ (x-axis 90 in arbitrary units) and $U_Q$ (y-axis 92 in arbitrary units) for the different materials structural steel, stainless steel and aluminium (curves 94a-9c) as the object 11 travels through the middle of the longitudinal measuring range. By comparing the parameter determined PSS, here $U_I$, $U_Q$, with varying object position, it is possible to draw conclusions about the type of material. Alternatively or additionally, the type of material of the object can be determined on the basis of a typical phase of the voltage induced by the object 11 in one or more receiving coils 18, 68a, 68b. A typical phase may be defined in a time period as the most frequently occurring phase value (or mean value) of the inducible voltage, if it can be assumed that determination of the phase cannot be prevented by excessively narrow amplitudes. It may be necessary to take into account that the sign of the inducible voltage also depends on the object position, and a corresponding phase shift can be corrected before determining the mean value. Alternatively or additionally, the type of material of the object can be determined from a typical relationship between the change in amplitude and change in phase of the oscillator voltage $U_{OSC}$. In this connection, the typical ratio can be regarded as constant and assumed to be known beforehand. Owing to the possible measurement inaccuracies, it is advantageous or necessary to determine the relations described above at larger values of the proximity signal or longitudinal position signal or over a period of time.

FIGS. 11A-11E show various quantities in the steps of the signal evaluation described above. The quantities are functions of the object position P (x-axes 96a-96e, in units of millimeters (mm)) for different vertical object distances D=0.25 mm (curves 98a, 100a, 102a, 104a, 106a; solid lines), D=0.50 mm (curves 98b, 100b, 102b, 104b, 106b; dashed lines) and D=0.75 mm (curves 98c, 100c, 102c, 104c, 106c; dotted lines), when the object 11 moves along the sensitive axis S1 of the sensor device 10 in FIG. 1. The y-axes 108a-108e are given in arbitrary units in each case for the corresponding quantity.

FIG. 11A and FIG. 11B show in each case the quantities $U_D$ and $S_N$, wherein in this special case the proximity signal is formed as $S_N = (U_{D0} - U_D)$. $U_{D0}$ and $U_D$ are digital values of the corresponding voltages, and may be regarded as dimensionless values. FIG. 11C shows the variation of the quadrature component $U_Q$ of the induced voltage. In FIGS. 11A, 11B and 11C it is to be noted that the shapes of the curves depend on the distance D. In contrast, as shown in FIG. 11D, the ratio $V_M$ substantially does not have any dependence on the object distance D. Determination of the ratio $V_M$ does not require a learning process, but determination of the mechanical phase $P_M$ shown in FIG. 11E is only possible if in each case a learning operation has been carried out beforehand at each object distance D. However, determination of the longitudinal position P by determining the mechanical phase $P_M$ offers a larger measuring range or linearization range of about 18 mm compared to a linearizable measuring range of about 10 mm of the $V_M$ curves in FIG. 11D, if a total length of the coil arrangement 14 of 12.5 mm is assumed for a housing with 15 mm longitudinal extension. Each curve 106a-106c shown in FIG. 11E was calculated after the corresponding individual learning operations with the distance-specific B values, so that the B values were calculated as $B=k/S_{NL}$ with the same object-specific k-factor.

Although only a few embodiments of the present invention have been shown and described, it is to be understood that many changes and modifications may be made thereunto without departing from the spirit and scope of the invention.

What is claimed is:

1. An inductive sensor device (10) for determining a longitudinal position (P) of an object (11) which is moveable at a distance from an end face (12) of the sensor device (10) and which is at least partially electrically conductive and/or magnetically polarizable, along a sensitive axis (S1) of the sensor device (10),
wherein the sensor device (10) has a coil arrangement (14) and sensor electronics (30),
wherein the coil arrangement (14) has a substantially planar exciting coil (16), by means of which an alternating magnetic field is producible for inducing eddy currents and/or magnetic polarization in the object (11), and a first substantially planar receiving coil (18; 18a-18b), which is arranged substantially parallel to and overlapping the exciting coil (16),
wherein the exciting coil (16) and the first receiving coil (18; 18a-18b) are arranged substantially parallel to the end face (12) of the sensor device (10), and
wherein the sensor electronics (30) are configured to determine at least one parameter (DSS) of an electrical signal of the exciting coil (16), which is variable owing to an inductive backward effect of the object (11), and at least one parameter (PSS) of a voltage inducible in the at least first receiving coil (18; 18a-18b) owing to the inductive backward effect of the object (11) and to determine the longitudinal position (P) from the determined parameter (DSS) of the electrical signal of the exciting coil (16) and the determined parameter (PSS) of the inducible voltage in the first receiving coil (18; 18a-18b).

2. A sensor device according to claim 1, wherein the sensor electronics (30) are configured to determine a vertical distance (D) of the object (11) between the end face (11) of the sensor device (10) and the object (11) from the at least one parameter determined (DSS) of the electrical signal of the exciting coil (16) and the at least one parameter determined (PSS) of the inducible voltage of the receiving coil (18; 18a-18b).

3. The sensor device according to claim 1, wherein the first receiving coil (18; 18a-18b) is of anti-symmetrically polarizable configuration along the sensitive axis (S1).

4. The sensor device (10) according to claim 1,
wherein the coil arrangement (14) has a second substantially planar receiving coil (18b), which is arranged substantially parallel to and overlapping the exciting coil (16), and
wherein the second receiving coil (18b) overlaps the first receiving coil (18a) in the end regions thereof and is connected electrically in series with the first receiving coil (18a).

5. The sensor device (10) according to claim 1,
wherein the coil arrangement (14) has at least a third substantially planar receiving coil (68), which is arranged substantially parallel to and overlapping the exciting coil (16) and which defines an additional sensitive axis (S2) of the sensor device (10), which extends substantially perpendicular to or in the sensitive axis (S1) of the first receiving coil (18; 18a, 18b), and
wherein the sensor electronics (30) are configured to determine at least one parameter (LSS) of a voltage inducible in the third receiving coil (68) due to the inductive backward effect of the object (11) and for determining the lateral position (L) of the object (11) along the additional sensitive axis (S2) from the determined at least one parameter (DSS) of an electrical signal of the exciting coil (16) and the determined at least one parameter (LSS) of the inducible voltage of the third receiving coil (68).

6. The sensor device (10) according to claim 5,
wherein the coil arrangement (14) has a fourth substantially planar receiving coil, which is arranged substantially parallel to and overlapping the exciting coil (16), and
wherein the fourth receiving coil overlaps the third receiving coil (68) in the end regions thereof and is connected electrically in series with the third receiving coil (68).

7. The sensor device (10) according to claim 1, wherein the exciting coil (16), the first receiving coil (18; 18a), the second receiving coil (18b), the third receiving coil (68) and/or the fourth receiving coil are arranged on or in one or more layers (50, 52, 60, 62) of a printed-circuit board (38).

8. The sensor device (10) according to claim 7, wherein windings (56, 58) of coil segments (21a, 21b; 40a, 40b) of the receiving coil (18; 18a-18b; 68) are oppositely directed, viewed along their respective sensitive axis (S1, S2).

9. The sensor device (10) according to claim 1, wherein the exciting coil (16), the first receiving coil (18; 18a), the second receiving coil (18b), the third receiving coil (68) and/or the fourth receiving coil are made by a wire-wrapping technique.

10. The sensor device (10) according to claim 9, wherein the receiving coil (18; 18a-18b; 68), viewed along their respective sensitive axis (S1, S2), has substantially centrally crossed windings (20a, 20b).

11. The sensor device (10) according to claim 1, wherein the sensor device (10) further comprises a first electrically conductive shielding element (22a), which surrounds the coil arrangement (14) laterally, in particular completely.

12. The sensor device (10) according to claim 11, wherein, viewed in a direction perpendicular to the sensitive axis (S1, S2), symmetrically and on either side of the coil arrangement (14), in each case a coil-free region (66) is provided adjacent to the first shielding element (22a), whose width (d) is at least 10% of a width (b) of an opening (64) of the first shielding element (22a).

13. The sensor device (10) according to claim 1, wherein the sensor device (10) further comprises a second electrically conductive, planar shielding element (22b), which is arranged on a side of the coil arrangement (14) that is turned away from the object (11).

14. The sensor device (10) according to claim 1, wherein the exciting coil (16) is excitable substantially with a periodic, in particular a substantially sinusoidal, current or a periodic, in particular a substantially sinusoidal, voltage.

15. The sensor device (10) according to claim 1, wherein the exciting coil (16) is a part of an oscillating circuit (80) of the sensor electronics (30).

16. The sensor device (10) according to claim 1, wherein the exciting coil (16), as an inductive element of an LC circuit, is a part of a self-oscillating LC oscillating circuit (80).

17. The sensor device (10) according to claim 1, wherein the at least one parameter (DSS) determined from the electrical signal of the exciting coil is a frequency ($f_{OSC}$), or an amplitude ($U_D$).

18. The sensor device (10) according to claim 1, wherein the sensor electronics (30) are configured for determining a proximity signal ($S_N$) from the changes of the determinable parameter of the electrical signal of the exciting coil (16) caused by the presence of the object (11), which is indicative of the change of the at least one parameter (DSS) caused by the presence of the object (11).

19. The sensor device (10) according to claim 18,
wherein the sensor electronics (30) are configured for determining a longitudinal position signal ($S_P$) from the at least one parameter (PSS, LSS) of the inducible voltage, and
wherein the longitudinal position signal ($S_P$) is based on the at least one parameter (PSS, LSS) of the inducible voltage.

20. The sensor device (10) according to claim 19, wherein the sensor electronics (30) are configured for determining a reduced longitudinal position signal ($V_M$) as a ratio of the longitudinal position signal ($S_P$) and the proximity signal ($S_N$), in order to determine the longitudinal position (P) from the reduced longitudinal position signal ($V_M$).

21. The sensor device (10) according to claim 20, wherein the sensor electronics (30) are configured to determine the longitudinal position (P) from the reduced longitudinal position signal ($V_M$) by means of a linearization function.

22. The sensor device (10) according to claim 21, wherein the linearization is to be carried out in relation to the type of material of the object.

23. The sensor device (10) according to claim 20, wherein the sensor electronics (30) are configured for determining a mechanical phase ($P_M$) as arctan 2 from the reduced longitudinal position signal ($V_P$) and the proximity signal ($S_N$) multiplied by a scaling factor (B) determined in a prior learning process, in order to determine the longitudinal position (P) from the mechanical phase ($P_M$).

24. The sensor device (10) according to claim 23, wherein the sensor electronics (30) are configured for linearizing the mechanical phase ($V_P$).

25. The sensor device (10) according to claim 1, wherein the sensor electronics (30) are configured for determining at least one reference signal (PHA; $I_{ref}$, $Q_{ref}$, $\varphi_{ref}$) from an electrical signal of the exciting coil (16), whose phase has a predetermined ratio to a phase of the electrical signal of the exciting coil (16).

26. The sensor device (10) according to claim 25, wherein the sensor electronics (30) are configured for determining the at least one parameter (PSS, LSS) of the inducible voltage by means of a synchronous demodulation from the inducible voltage using the reference signal (PHA; $\varphi_{ref}$).

27. The sensor device (10) according to claim 26,
wherein the at least one parameter (PSS, LSS) is an amplitude ($U_\varphi$) of a phase-sensitive demodulated inducible voltage.

28. The sensor device (10) according to claim 25, wherein the sensor electronics (30) are configured for determining the at least one parameter ($U_I$, $U_Q$) of the inducible voltage by quadrature demodulation of the inducible voltage using the reference signal (PHA; $I_{ref}$, $Q_{ref}$).

29. The sensor device (10) according to claim 28, wherein the at least one parameter (PSS, LSS) of the inducible voltage is a phase-related amplitude ($U_I$, $U_Q$) of a quadrature-demodulated inducible voltage.

30. The sensor device (10) according to claim 1,
wherein the sensor electronics (30) are configured for determining a type of an object material of the object (11) based on a typical phase of the voltage inducible by the object (11) with respect to the phase of an electrical signal of the exciting coil (16) or
wherein the sensor electronics (30) are configured for determining the type of object material of the object (11) based on a typical ratio of the amplitude change and frequency change of the oscillator voltage ($U_{OSC}$) caused by the presence of the object (11).

31. The sensor device (10) according to claim 1, wherein the sensor electronics (30) implement a self-parameterizing evaluation algorithm using machine learning or artificial neural networks.

32. The sensor device (10) according to claim 1, wherein the sensor electronics (30) are configured for self-adaptively parameterizing an evaluation algorithm, self-adaptively determining a type of the object material of the object (11) and/or self-adaptively recognizing a change of a measuring arrangement using machine learning or artificial neural networks.

33. The sensor device (10) according to claim 32, wherein the sensor electronics (30) are configured, for self-adaptive parameterization of the evaluation algorithm using machine learning or artificial neural networks, to determine one or more values of the at least one parameter (DSS, PSS, LSS) and store them temporarily or permanently.

34. A method for operating an inductive sensor device (10) for determining a longitudinal position (P) of an object (11) which is moveable at a distance from an end face (12) of the sensor device (10) and which is at least partially electrically conductive and/or magnetically polarizable, along a sensitive axis (S1) of the sensor device (10), wherein the method comprises:
producing an alternating magnetic field of a substantially planar exciting coil (16) of a coil arrangement (14) of the sensor device (10) for inducing eddy currents and/or magnetic polarization in the object (11),
determining, by means of sensor electronics (30) of the sensor device (10), at least one parameter (DSS) of an electrical signal of the exciting coil (16), which is altered by an inductive backward effect of the object (11), and at least one parameter (PSS) of a voltage induced in a first receiving coil (18; 18a-18b) of the coil arrangement (14) owing to the inductive backward effect of the object (16), wherein the first receiving coil (18; 18a-18b) is of substantially planar configuration and is arranged substantially parallel to and overlapping the exciting coil (16), wherein the exciting coil (16) and the first receiving coil (18; 18a-18b) are arranged substantially parallel to the end face (12) of the sensor device (10), and
determining, by means of the sensor electronics (30), the longitudinal position (P) based on the at least one parameter (DSS) of the electrical signal of the exciting coil (16) and the at least one parameter (PSS) of the induced voltage of the first receiving coil (18; 18a, 18b).

35. A non-transitory computer-readable storage medium that stores a computer program comprising a set of computer readable instructions, which, when executed by the computer, carry out all steps of the method according to claim 34.

* * * * *